(12) United States Patent
Sato

(10) Patent No.: US 9,257,451 B2
(45) Date of Patent: Feb. 9, 2016

(54) DISPLAY DEVICE AND SEMICONDUCTOR DEVICE

(71) Applicant: SEMICONDUCTOR ENERGY LABORATORY CO., LTD., Atsugi-shi, Kanagawa-ken (JP)

(72) Inventor: Mizuki Sato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/661,078

(22) Filed: Mar. 18, 2015

(65) Prior Publication Data

US 2015/0194447 A1 Jul. 9, 2015

Related U.S. Application Data

(63) Continuation of application No. 14/275,962, filed on May 13, 2014, now Pat. No. 9,029,859, which is a continuation of application No. 13/848,878, filed on Mar. 22, 2013, now Pat. No. 8,969,859, which is a (Continued)

(30) Foreign Application Priority Data

Jul. 21, 2006 (JP) ................... 2006-199292

(51) Int. Cl.
*H01L 29/12* (2006.01)
*H01L 29/786* (2006.01)
*H01L 27/12* (2006.01)
(Continued)

(52) U.S. Cl.
CPC .......... *H01L 27/1222* (2013.01); *H01L 27/124* (2013.01); *H01L 27/1255* (2013.01); *H01L 29/786* (2013.01); *H01L 29/78663* (2013.01); *H01L 29/78672* (2013.01);
(Continued)

(58) Field of Classification Search
CPC ..................... H01L 27/3244; H01L 29/78627; H01L 29/78696; H01L 29/786; H01L 27/1214; H01L 27/10805; G02F 1/136286
See application file for complete search history.

(56) References Cited

U.S. PATENT DOCUMENTS 5,650,636 A 7/1997 Takemura et al.
5,693,959 A 12/1997 Inoue et al.

(Continued)

FOREIGN PATENT DOCUMENTS

CN 001432984 A 7/2003
CN 001573870 A 2/2005

(Continued)

OTHER PUBLICATIONS

Korean Office Action (Application No. 2007-0072546) Dated Apr. 1, 2014.

(Continued)

*Primary Examiner* — Victor A Mandala
(74) *Attorney, Agent, or Firm* — Fish & Richardson P.C.

(57) ABSTRACT

An object is to provide a display device with a high aperture ratio or a semiconductor device in which the area of an element is large. A channel formation region of a TFT with a multi-gate structure is provided under a wiring that is provided between adjacent pixel electrodes (or electrodes of an element). In addition, a channel width direction of each of a plurality of channel formation regions is parallel to a longitudinal direction of the pixel electrode. In addition, when a channel width is longer than a channel length, the area of the channel formation region can be increased.

20 Claims, 17 Drawing Sheets

Related U.S. Application Data continuation of application No. 12/982,200, filed on Dec. 30, 2010, now Pat. No. 8,426,860, which is a continuation of application No. 11/772,924, filed on Jul. 3, 2007, now Pat. No. 7,863,612.

(51) Int. Cl.
  *G02F 1/1362* (2006.01)
  *H01L 27/108* (2006.01)
  *H01L 27/32* (2006.01)

(52) U.S. Cl.
  CPC ....... *H01L 29/78696* (2013.01); *G02F 1/1362* (2013.01); *H01L 27/10805* (2013.01); *H01L 27/3244* (2013.01)

(56) References Cited

U.S. PATENT DOCUMENTS

| | | | |
|---|---|---|---|
| 5,877,512 A * | 3/1999 | Kim | G02F 1/136286 257/57 |
| 6,084,579 A | 7/2000 | Hirano | |
| 6,380,561 B1 | 4/2002 | Ohtani et al. | |
| 6,392,255 B1 | 5/2002 | Shibata et al. | |
| 6,531,713 B1 * | 3/2003 | Yamazaki | G02F 1/13454 257/350 |
| 6,624,012 B2 | 9/2003 | Shibata et al. | |
| 6,690,033 B2 | 2/2004 | Yamazaki et al. | |
| 6,867,108 B2 * | 3/2005 | Jeong | G02F 1/13458 257/59 |
| 6,888,164 B2 * | 5/2005 | Tanaka | G02F 1/136213 257/347 |
| 6,909,240 B2 | 6/2005 | Osame et al. | |
| 6,936,846 B2 | 8/2005 | Koyama et al. | |
| 6,998,299 B2 | 2/2006 | Shibata et al. | |
| 7,038,240 B2 | 5/2006 | Matsumoto | |
| 7,049,634 B2 | 5/2006 | Yamazaki | |
| 7,071,911 B2 | 7/2006 | Inukai | |
| 7,102,161 B2 | 9/2006 | Inukai | |
| 7,102,293 B2 | 9/2006 | Matsumoto | |
| 7,105,392 B2 | 9/2006 | Isobe et al. | |
| 7,126,268 B2 | 10/2006 | Kitazawa | |
| 7,142,781 B2 | 11/2006 | Koyama et al. | |
| 7,148,092 B2 | 12/2006 | Isobe et al. | |
| 7,233,020 B2 | 6/2007 | Park et al. | |
| 7,250,720 B2 | 7/2007 | Sakakura et al. | |
| 7,262,556 B2 * | 8/2007 | Osame | G09G 3/3233 315/169.1 |
| 7,282,737 B2 | 10/2007 | Shibata et al. | |
| 7,311,953 B2 | 12/2007 | Araya et al. | |
| 7,324,075 B2 | 1/2008 | Sano et al. | |
| 7,414,362 B2 | 8/2008 | Chung et al. | |
| 7,477,218 B2 | 1/2009 | Koga et al. | |
| 7,541,618 B2 | 6/2009 | Shibata et al. | |
| 7,612,368 B2 | 11/2009 | Yu | |
| 7,683,860 B2 | 3/2010 | Nagao et al. | |
| 7,723,721 B2 | 5/2010 | Udagawa et al. | |
| 7,737,506 B2 | 6/2010 | Isobe et al. | |
| 7,749,818 B2 | 7/2010 | Isobe et al. | |
| 7,795,734 B2 | 9/2010 | Isobe et al. | |
| 8,018,403 B2 | 9/2011 | Sakakura et al. | |
| 8,097,882 B2 | 1/2012 | Park | |
| 8,139,001 B2 | 3/2012 | Sakakura et al. | |
| 8,154,015 B2 | 4/2012 | Udagawa et al. | |
| 8,324,618 B2 | 12/2012 | Udagawa et al. | |
| 8,648,338 B2 | 2/2014 | Udagawa et al. | |
| 8,674,908 B2 | 3/2014 | Sakakura et al. | |
| 9,054,199 B2 | 6/2015 | Udagawa et al. | |
| 2001/0010370 A1 * | 8/2001 | Kimura | G02F 1/134363 257/59 |
| 2002/0056838 A1 | 5/2002 | Ogawa | |
| 2002/0096682 A1 | 7/2002 | Ohtani et al. | |
| 2003/0062499 A1 | 4/2003 | Yamazaki | |
| 2003/0222589 A1 | 12/2003 | Osame et al. | |
| 2004/0016927 A1 | 1/2004 | Takei et al. | |
| 2004/0155242 A1 * | 8/2004 | Segawa | G02F 1/136213 257/59 |
| 2005/0231122 A1 | 10/2005 | Osame et al. | |
| 2006/0061526 A1 | 3/2006 | Shirasaki et al. | |
| 2006/0081844 A1 * | 4/2006 | Hirosue | H01L 27/12 257/59 |
| 2007/0181885 A1 | 8/2007 | Tanaka | |
| 2008/0073625 A1 | 3/2008 | Araya et al. | |
| 2008/0170005 A1 | 7/2008 | Osame et al. | |
| 2008/0258618 A1 | 10/2008 | Chung et al. | |
| 2013/0214280 A1 | 8/2013 | Sato | |

FOREIGN PATENT DOCUMENTS

| | | |
|---|---|---|
| CN | 001591052 A | 3/2005 |
| EP | 1087438 A | 3/2001 |
| EP | 1148553 A | 10/2001 |
| EP | 1209748 A | 5/2002 |
| EP | 1310997 A | 5/2003 |
| JP | 04-293018 A | 10/1992 |
| JP | 06-188418 A | 7/1994 |
| JP | 07-130652 A | 5/1995 |
| JP | 08-213632 A | 8/1996 |
| JP | 11-312808 A | 11/1999 |
| JP | 2001-094112 A | 4/2001 |
| JP | 2002-006777 A | 1/2002 |
| JP | 2002-014331 A | 1/2002 |
| JP | 2002-196706 A | 7/2002 |
| JP | 2002-278478 A | 9/2002 |
| JP | 2003-050405 A | 2/2003 |
| JP | 2003-084689 A | 3/2003 |
| JP | 2003-108036 A | 4/2003 |
| JP | 2003-131590 A | 5/2003 |
| JP | 2003-163084 A | 6/2003 |
| JP | 2003-228299 A | 8/2003 |
| JP | 2003-295793 A | 10/2003 |
| JP | 2003-330391 A | 11/2003 |
| JP | 2004-264673 A | 9/2004 |
| JP | 2004-341513 A | 12/2004 |
| JP | 2005-106993 A | 4/2005 |
| JP | 2005-128574 A | 5/2005 |
| JP | 2005-157265 A | 6/2005 |
| JP | 2005-157266 A | 6/2005 |
| JP | 2005-182061 A | 7/2005 |
| JP | 2005-202365 A | 7/2005 |
| JP | 2005-340852 A | 12/2005 |
| JP | 2006-011059 A | 1/2006 |
| JP | 2006-018301 A | 1/2006 |
| JP | 2006-066871 A | 3/2006 |
| JP | 2006-091089 A | 4/2006 |
| JP | 2006-140140 A | 6/2006 |
| JP | 2006-189852 A | 7/2006 |
| JP | 2006-337713 A | 12/2006 |
| KR | 2003-0030904 A | 4/2003 |
| KR | 2004-0078581 A | 9/2004 |
| KR | 2005-0050494 A | 5/2005 |
| KR | 2005-0105113 A | 11/2005 |

OTHER PUBLICATIONS

Office Action (Application No. 200710136692.2) Dated Feb. 12, 2010.
Korean Office Action (Application No. 2007-0072546) Dated Oct. 25, 2013.
Chinese Office Action (Application No. 201210004871.1) Dated Nov. 13, 2013.
Korean Office Action (Application No. 2013-0162754) Dated Mar. 4, 2014.
Chinese Office Action (Application No. 201210004871.1) Dated May 15, 2014.

* cited by examiner

DISPLAY DEVICE AND SEMICONDUCTOR DEVICE

CROSS-REFERENCE TO RELATED APPLICATIONS

This application is a continuation of U.S. application Ser. No. 14/275,962, filed May 13, 2014, now pending, which is continuation of U.S. application Ser. No. 13/848,878, filed Mar. 22, 2013, now pending, which is a continuation of U.S. application Ser. No. 12/982,200, filed Dec. 30, 2010, now U.S. Pat. No. 8,426,860, which is a continuation of U.S. application Ser. No. 11/772,924, filed Jul. 3, 2007, now U.S. Pat. No. 7,863,612, which claims the benefit of a foreign priority application filed in Japan as Serial No. 2006-199292 on Jul. 21, 2006, all of which are incorporated by reference.

BACKGROUND OF THE INVENTION

1. Field of the Invention

The present invention relates to an active matrix display device and a semiconductor device in which elements are arranged in matrix.

2. Description of the Related Art

As an image display device, a liquid crystal display device, an electroluminescence (hereinafter referred to as "EL") display device, and the like have been previously known. As types of these display devices, there are a passive matrix display device and an active matrix display device. The active matrix display device can perform high-speed operation even when the number of pixels is increased.

As the active matrix display device, a TFT, a capacitor, a wiring, a pixel electrode, and the like are formed over one substrate; because of this, an aperture ratio tends to decrease. Accordingly, an attempt to increase the aperture ratio is done by creating design such as materials, shapes, the number, or arrangement of the TFT, the capacitor, the wiring, the pixel electrode, and the like. For example, a method for decreasing the area of a capacitor by using tantalum oxide, which has a high dielectric constant, as a dielectric of the capacitor is disclosed in Patent Document 1.

Patent Document 1: Japanese Published Patent Application No. H11-312808.

SUMMARY OF THE INVENTION

On the other hand, there is a problem in that, in order to increase the aperture ratio, a method in which a material with a high dielectric constant is used for a capacitor leads to an increase in the number of manufacturing steps.

Here, in order to increase the aperture ratio without increasing the number of manufacturing steps, the area of an opening may be increased. However, when an opening is provided between wirings in order to increase the area of the opening, the shape of the opening is a complex shape. In an EL display device, when the shape of an opening is a complex shape, the length of an edge (end) of the opening becomes longer; therefore, a problem arises in that shrinkage of an EL light-emitting portion is promoted.

Here, the shrinkage of the EL light-emitting portion refers to a state in which an effective area of an EL element (an area of a portion in which the EL element emits light) gradually decreases starting from an end, not a state in which an EL layer physically decreases.

In addition, in a semiconductor device (e.g. DRAM or the like) other than a display device, it is preferable that the area of an element connected to a transistor be increased.

Thus, it is an object of the present invention to provide a display device with a high aperture ratio (or a semiconductor device with a large area of an element).

In this specification, a channel formation region of a TFT means a semiconductor region which is placed under a gate electrode with a gate insulating film interposed therebetween. A channel length means the length in a direction in which carriers flow in the channel formation region. A channel width means the length of the channel formation region, which is perpendicular to a channel length direction.

Note that in the case of a TFT with a multi-gate structure, the channel length and the channel width refer to the dimensions of each channel formation region.

In addition, a multi-gate structure is a structure in which one TFT includes a plurality of channel formation regions. On the other hand, a single-gate structure is a structure in which one TFT includes one channel formation region.

A display device of the present invention includes a wiring provided between adjacent pixel electrodes and a thin film transistor, where a channel formation region of the thin film transistor is provided under the wiring, the channel formation region is provided at a position overlapping with the wiring, and a channel width direction of the channel formation region is parallel to a direction in which current flows through the wiring.

In addition, a display device of the present invention includes a wiring provided between adjacent pixel electrodes and a thin film transistor that includes a plurality of channel formation regions, where the plurality of channel formation regions is provided under the wiring, the plurality of channel formation regions is provided at a position overlapping with the wiring, and a channel width direction of each of the plurality of channel formation regions is parallel to a direction in which current flows through the wiring.

In addition, a display device of the present invention includes a wiring provided between adjacent pixel electrodes and a thin film transistor, where a channel formation region of the thin film transistor is provided under the wiring, the channel formation region is provided at a position overlapping with the wiring, and a channel width direction of the channel formation region is parallel to a longitudinal direction of the wiring.

In addition, a display device of the present invention includes a wiring provided between adjacent pixel electrodes and a thin film transistor that includes a plurality of channel formation regions, where the plurality of channel formation regions is provided under the wiring, the plurality of channel formation regions is provided at a position overlapping with the wiring, and a channel width direction of each of the plurality of channel formation regions is parallel to a longitudinal direction of the wiring.

In addition, a display device of the present invention includes a wiring provided between adjacent pixel electrodes and a thin film transistor, where a channel formation region of the thin film transistor is provided under the wiring, the channel formation region is provided at a position overlapping with the wiring, and a channel width direction of the channel formation region is parallel to a longitudinal direction of the pixel electrode.

In addition, a display device of the present invention includes a wiring provided between adjacent pixel electrodes and a thin film transistor that includes a plurality of channel formation regions, where the plurality of channel formation regions is provided under the wiring, the plurality of channel formation regions is provided at a position overlapping with the wiring, and a channel width direction of each of the plurality of channel formation regions is parallel to a longitudinal direction of the pixel electrode.

One feature of the display device of the present invention is that the thin film transistor operates in a linear region.

A voltage between a gate and a source of a transistor is set as Vgs, a voltage between the source and a drain of the transistor is set as Vds, and a threshold voltage of the transistor is set as Vth. In this case, a range where a relational expression of $|Vgs-Vth|\geq|Vds|$ is satisfied is referred to as a linear region.

That is, one feature is that the thin film transistor operates in the range where the voltage (Vgs) between the gate and the source is greater than or equal to the voltage (Vds) between the source and the drain by the amount of the threshold voltage (Vth) or more.

One feature of the display device of the present invention is that a channel width of the channel formation region is longer than a channel length of the channel formation region.

One feature of the display device of the present invention is that a longitudinal direction of an impurity region connecting the channel formation regions is parallel to a channel width direction.

One feature of the display device of the present invention is that the channel formation region is at least one of an amorphous semiconductor and a polycrystalline semiconductor.

One feature of the display device of the present invention is that the channel forming region is single crystal.

One feature of the display device of the present invention is that the thin film transistor includes an island-shaped semiconductor layer, a gate insulating film, and a gate electrode, where the island-shaped semiconductor layer includes the plurality of channel formation regions and a plurality of impurity regions, and a gate electrode is formed over the plurality of channel formation regions with a gate insulating film interposed therebetween.

One feature of the display device of the present invention is that the wiring is formed over the gate electrode with an interlayer insulating film interposed therebetween.

One feature of the display device of the present invention is that a first capacitor that includes the island-shaped semiconductor layer, the gate insulating film over the island-shaped semiconductor layer and the gate electrode over the gate insulating film, and a second capacitor that includes the gate electrode, the interlayer insulating film over the gate electrode and the wiring over the interlayer insulating film are formed.

One feature of the display device of the present invention is that a longitudinal direction of the gate electrode is the channel width direction.

One feature of the display device of the present invention is that the wiring is formed under a partition wall (insulator) that is formed to cover an end of the pixel electrode.

One feature of the display device of the present invention is that either one of a source terminal (region) or drain terminal (region) of the thin film transistor is connected to one of the adjacent pixel electrodes.

One feature of the display device of the present invention is that the other one of the source terminal (region) or drain terminal (region) of the thin film transistor is connected to the wiring.

A semiconductor device of the present invention includes a wiring provided between adjacent electrodes and a thin film transistor, where a channel formation region of the thin film transistor is provided under the wiring, the channel formation region is provided at a position overlapping with the wiring, and a channel width direction of the channel formation region is parallel to a direction in which current flows through the wiring (or a longitudinal direction of the wiring).

In addition, a semiconductor device of the present invention includes a wiring provided between adjacent electrodes and a thin film transistor, where a channel formation region of the thin film transistor is provided under the wiring, the channel formation region is provided at a position overlapping with the wiring, and a channel width direction of the channel formation region is parallel to a longitudinal direction of the electrode.

In addition, a semiconductor device of the present invention includes a wiring provided between adjacent elements and a thin film transistor, where a channel formation region of the thin film transistor is provided under the wiring, the channel formation region is provided at a position overlapping with the wiring, and a channel width direction of the channel formation region is parallel to a direction in which current flows through the wiring (or a longitudinal direction of the wiring).

In addition, a semiconductor device of the present invention includes a wiring provided between adjacent elements and a thin film transistor, where a channel formation region of the thin film transistor is provided under the wiring, the channel formation region is provided at a position overlapping with the wiring, and a channel width direction of the channel formation region is parallel to a longitudinal direction of the element.

One feature of the semiconductor device of the present invention is that a channel width of the channel formation region is longer than a channel length of the channel formation region.

According to the present invention, a display device with a high aperture ratio (or a semiconductor device in which the area of an element is large) can be realized.

In addition, the shape of a pixel electrode (or an electrode of an element) need not to be a complex shape in order to increase the aperture ratio.

Furthermore, by increasing the aperture ratio, current density for an element is lowered; because of this, the life of an element can be lengthened.

DETAILED DESCRIPTION OF THE INVENTION

Figure 1:
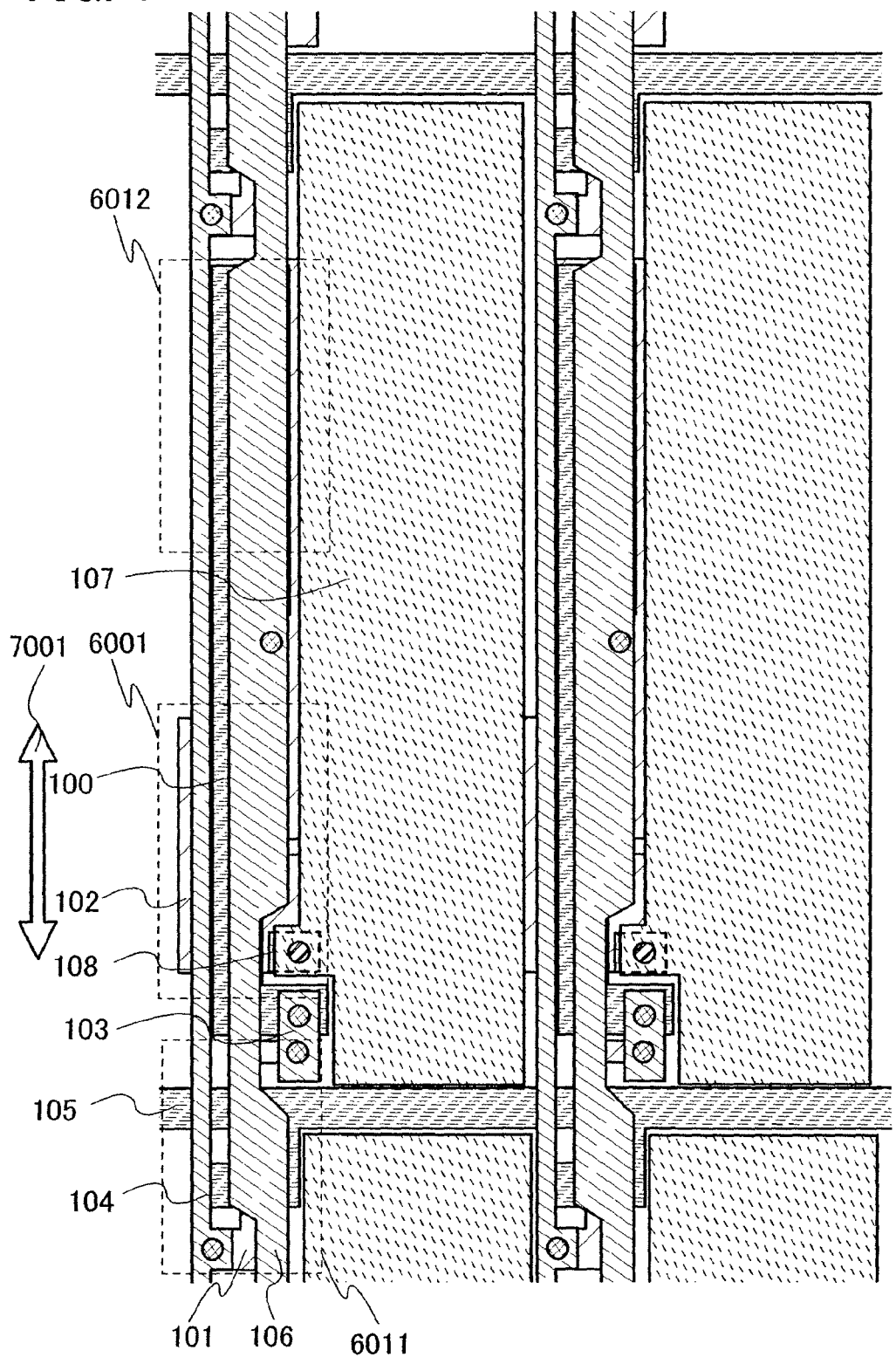
FIG. 1 is a layout 1 of a double-gate structure.

Hereinafter, embodiment modes of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment modes.

Note that each of Embodiment Modes 1 to 11 can be combined, as appropriate.

Embodiment Mode 1

In this embodiment mode, a pixel structure and a layout of a display device of the present invention will be described. Note that a pixel formed of two TFTs is described here.

First, the pixel structure of the display device of the present invention is described with reference to FIG. 3. A pixel includes a TFT (driving TFT 301) connected to a pixel electrode, a capacitor 300, a switching TFT 302, a display element 303, a scanning line 305, a signal line 304, and a power supply line 306. Note that the driving TFT 301 and the switching TFT 302 each have a double-gate structure that includes two channel formation regions.

Note that the driving TFT 301 may have a single-gate structure or a multi-gate structure that includes three or more channel formation regions.

Either one of a source terminal or drain terminal of the switching TFT 302 is connected to the signal line 304.

A gate terminal of the switching TFT 302 is connected to the scanning line 305.

The other one of the source terminal or drain terminal of the switching TFT 302 is electrically connected to a gate terminal of the driving TFT 301 and one electrode of the capacitor.

Either one of a source terminal or drain terminal of the driving TFT 301 is connected to the power supply line 306.

The other one of the source terminal or drain terminal of the driving TFT 301 is connected to the display element 303.

A gate terminal of the driving TFT 301 is connected to one electrode of the capacitor and the other one of the source terminal or drain terminal of the switching TFT 302.

The other terminal of the capacitor 300 is electrically connected to the power supply line 306.

One terminal of the capacitor 300 is electrically connected to the gate terminal of the driving TFT 301 and the other one of the source terminal or drain terminal of the switching TFT 302.

Next, a layout of a pixel portion is described with reference to FIGS. 1 and 2. FIG. 2 is a top view corresponding to FIG. 1 and a diagram of a stage in which a first semiconductor layer 101, a second semiconductor layer 102, a gate wiring 105, and a gate electrode 100 are formed.

Figure 2:
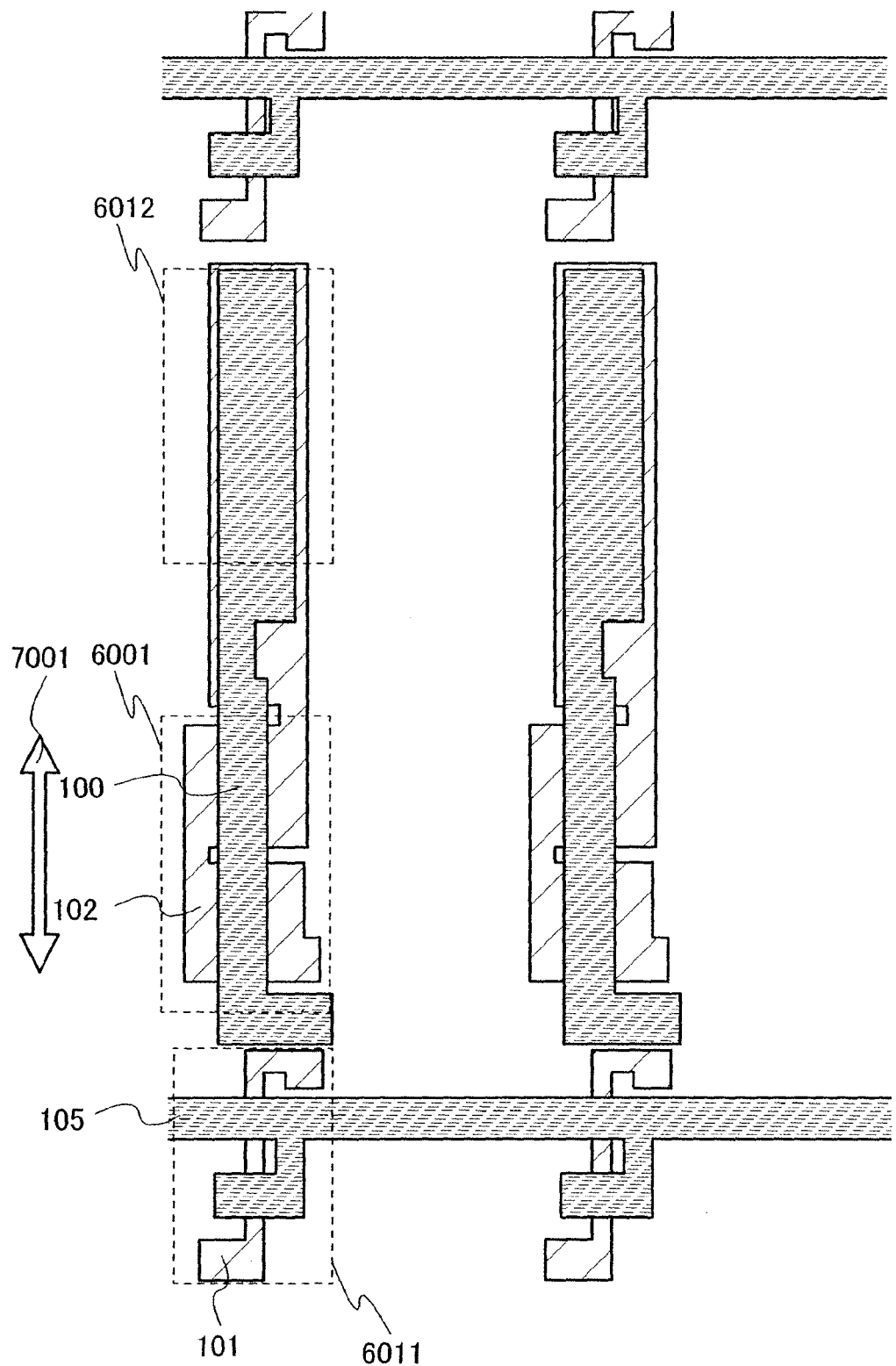
FIG. 2 is a layout 2 of a double-gate structure.
Figure 3:
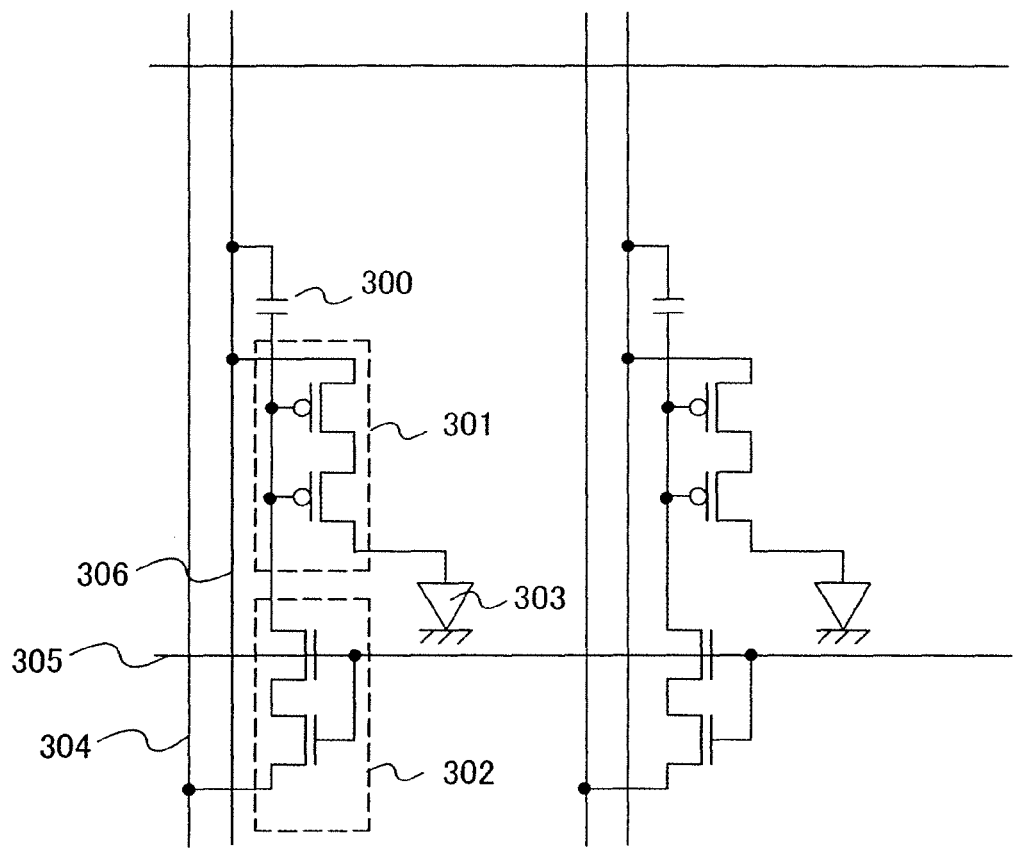
FIG. 3 is a circuit diagram of a pixel.

The correspondence relation among FIGS. 1, 2, and 3 is described.

A portion encircled by a dashed line portion 6001 corresponds to the driving TFT 301.

A portion encircled by a dashed line portion 6011 corresponds to the switching TFT 302.

A portion encircled by a dashed line portion 6012 corresponds to the capacitor 300.

A pixel electrode 107 corresponds to the pixel electrode of the display element 303.

A signal line 104 corresponds to the signal line 304.

A power supply line 106 corresponds to the power supply line 306.

In FIG. 1, the first semiconductor layer 101 is an island-shaped semiconductor layer of the switching TFT. A region that overlaps with the gate wiring 105 is a channel formation region. A region that is connected to the signal line 104 is a source terminal (or a drain terminal). A region that is connected to a connection electrode 103 through a contact hole is a drain terminal (or a source terminal). Note that the switching TFT has a double-gate structure that includes two channel formation regions.

Note that the switching 1H may have a single-gate structure or a multi-gate structure that includes three or more channel formation regions.

In addition, the second semiconductor layer 102 is an island-shaped semiconductor layer of the driving TFT 301 that drives the display element. A region that overlaps with the gate electrode 100 is a channel formation region. The gate electrode of the driving TFT 301 is connected to the connection electrode 103 through a contact hole. Further, the source terminal (or the drain terminal) of the driving TFT 301 and the power supply line 106 are connected to each other through a contact hole. The drain terminal (or the source terminal) of the driving TFT 301 and a connection electrode 108 are connected to each other through a contact hole. In addition, the pixel electrode 107 is formed in contact with the connection electrode 108.

In addition, in the second semiconductor layer 102, the power supply line 106 is arranged over the channel formation region that overlaps with the gate electrode 100 with a gate insulating film interposed therebetween. A capacitor that is formed between the gate electrode 100 and the power supply line 106 can be used as a storage capacitor of the display element.

An interlayer insulating film is interposed between the gate electrode 100 and the power supply line 106.

In addition, the gate electrode 100 serves as one electrode of the capacitor and a portion that overlaps with the gate electrode of the power supply line serves as the other electrode of the capacitor.

In addition, in order to prevent a short circuit of the electrode of the display element, a region other than a light emitting area is covered with a partition wall (insulator). A width of a partition wall provided between right and left pixels that are adjacent to each other is approximately 20 μm to 25 μm, for example. In this embodiment mode, the signal line 104 and the power supply line 106 are arranged under a partition wall that has a width of 20 μm (that is, between adjacent pixel electrodes).

Note that, in this embodiment mode, a longitudinal direction of the power supply line 106 is arranged parallel to a longitudinal direction of the pixel electrode. Furthermore, a driving TFT is arranged under the power supply line 106 so that the driving TFT and the power supply line 106 overlap with each other. In addition, a channel width direction is arranged parallel to the longitudinal direction.

However, in the present invention, it is not always necessary that the power supply line 106 be arranged parallel to the longitudinal direction of the pixel electrode and the driving TFT 301 be arranged under the power supply line 106.

Therefore, when the signal line 104 is arranged parallel to the longitudinal direction of the pixel electrode, the driving TFT 301 may be arranged under the signal line 104 so that the driving TFT 301 and the signal line 104 overlap with each other.

In addition, when the shape of the pixel electrode has no longitudinal direction such as when the shape is a square, an approximate square (for example, a square with a truncated corner, a square with a rounded corner (not all of the corners are necessarily rounded, and some of the corners may be rounded), or the like), or a circle, there is no problem even when the driving TFT 301 is arranged under either the power supply line 106 or the signal line 104.

Note that as the shape of the pixel electrode, various shapes are considered, such as a rectangle, an approximate rectangle (for example, a rectangle with a truncated corner, a rectangle with a rounded corner (not all of the corners are necessarily rounded, and some of the corners may be rounded)), an ellipse, a polygon, or an approximate polygon (for example, a polygon with a truncated corner or a polygon with a rounded corner (not all of the corners are necessarily rounded, and some of the corners may be rounded)). Note that the shape of the pixel electrode is not limited to these described shapes. Note also that when the shape of the pixel electrode is a rectangle or an approximate rectangle, a wiring is easily arranged in lattice form, whereby design layout is easily performed, which is preferable.

In addition, the size of the pixel electrode may be different for each pixel. Furthermore, the shape of the pixel electrode may be different for each pixel.

In addition, when a required channel width is shorter than the length of a short side direction of the pixel electrode, the driving TFT 301 may be arranged under a wiring so that the driving TFT 301 and the wiring that is arranged parallel to the short side direction overlap with each other.

In addition, a part of the power supply line 106 may be arranged over or under the pixel electrode. In the case of such an arrangement, the gate electrode of the driving TFT 301 may be arranged so as to overlap with a part of the power supply line 106.

Note that a channel width direction of the driving TFT 301 is arranged parallel to a longitudinal direction of the wiring. Thus, the channel width can be increased. In addition, since the wiring is arranged between the adjacent pixel electrodes, the longitudinal direction of the wiring is arranged parallel to the longitudinal direction or short side direction of the pixel electrode, whereby the aperture ratio can be increased.

Note that since current generally flows in the longitudinal direction of the wiring, the channel width direction can be referred to as a direction parallel to the direction in which current flows through the wiring arranged over the channel formation region.

In addition, a case of operation in a linear region is shown in this embodiment mode. The driving TFT has a double-gate structure of L<W, where a channel length is L and a channel width is W. Here, the driving TFT has a double-gate structure in which L is approximately 7 μm and W is approximately 20 μm. When the design of the layout of the pixel is performed, by arranging the wiring under a partition wall that has a width of 20 μm and arranging the driving TFT under the wiring, the aperture ratio can be increased even when the size of the driving TFT is increased.

In this embodiment mode, patterning is performed such that the semiconductor layer is bent to be U-shaped with respect to the gate electrode 100 (the dashed line portion 6001 in FIGS. 1 and 2). Thus, the channel width direction can be arranged parallel to the longitudinal direction of the pixel electrode (an arrow 7001 in FIGS. 1 and 2).

Note that the longitudinal direction of the impurity region that connects the channel formation regions to each other is preferably arranged parallel to the channel width direction. By this, as large a TFT as will fit can be placed in the narrow space between the pixel electrodes (in the space between the adjacent pixel electrodes), whereby the aperture ratio can be increased. Furthermore, in the impurity region, since current flows in the longitudinal direction of the impurity region, the resistance of the impurity region can be increased. Accordingly, off-current can be reduced.

However, in the present invention, the channel width can be increased up to the length of the longitudinal direction side when the channel width direction is perpendicular to the longitudinal direction of the pixel electrode. Thus, the shape of the island-shaped semiconductor layer of the TFT is not limited to the U-shape as in this embodiment mode.

Note that the capacitor 300 can be formed of the second semiconductor layer 102, the gate electrode 100, and a gate insulating film (a first storage capacitor) formed between the second semiconductor layer 102 and the gate electrode 100, and the gate electrode 100, the power supply line 106, and an interlayer insulating film (a second storage capacitor) formed between the gate electrode 100 and the power supply line 106.

In this case, a storage capacitor is formed of the second semiconductor layer 102, the gate electrode 100, and the gate insulating film formed between the second semiconductor layer 102 and the gate electrode 100 in the dashed line portion 6012. Accordingly, by increasing the area of the gate electrode in the dashed line portion 6012, the size of the storage capacitor can be increased.

With the above-described structure, as large a TFT as will fit (specifically, a TFT with a large channel width) can be placed in the narrow space between the pixel electrodes (in the space between the adjacent pixel electrodes). Therefore, the aperture ratio can be increased.

Note that the TFT is very small; therefore, there is a problem in that electric characteristics easily vary due to variations in film thickness of the gate insulating film, variations in film quality, variations in an injection dose during an ion doping process, or the like.

In particular, when amorphous silicon, microcrystalline silicon, or polycrystalline silicon is used as a semiconductor of the TFT, variations in the characteristics of the TFT (e.g., on-current, off-current, threshold voltage, mobility, or the like) caused by the crystallinity of the semiconductor are generated. In particular, when the characteristics of the TFT connected to the pixel vary, current (or voltage) to be supplied to the pixel varies; therefore, there is a problem in that visibility of a display device deteriorates.

Thus, in order to solve the above-described problem, although there is a method for adopting a multi-gate structure, a TFT with the multi-gate structure has a larger area than a TFT with a single-gate structure. Therefore, when the TFT with the multi-gate structure is adopted in order to decrease variations in the electric characteristics of the TFT, the aperture ratio is decreased. However, by using the structure of the present invention, variations in the characteristics of the TFT can be reduced, and the aperture ratio can be increased, as well.

Here, in this embodiment mode, an example of a so-called constant voltage driving method in which the driving TFT operates in a linear region is described. The constant voltage driving method is described hereinafter.

There are the case where a TFT operates in a saturation region and the case where a TFT operates in a linear region. A voltage between a gate and a source of a transistor is set as Vgs, a voltage between the source and a drain of the transistor is set as Vds, and a threshold voltage of the transistor is set as Vth. In this case, a range where a relational expression of |Vgs−Vth|<|Vds| is satisfied is referred to as a saturation region. On the other hand, a range where a relational expression of $|Vgs-Vth|>|Vds|$ is satisfied is referred to as a linear region.

By operating a TFT connected to a pixel electrode of an EL element (hereinafter referred to as a "driving TFT") in a saturation region, a method in which constant current flows to a display element is referred to as a constant current driving method.

In the constant current driving method, since constant current can flow to the EL element, variations due to deterioration of the display element can be reduced. However, in the constant current driving method, when the driving TFT deteriorates, current that flows to the driving TFT is also decreased. Accordingly, variations of the TFT easily affect variations in brightness of the display element.

On the other hand, by operating the driving TFT in a linear region, a method in which a constant voltage is applied to the EL element is referred to as a constant voltage driving method.

In the constant voltage driving method, since the TFT operates in a linear region, a voltage between a source and a drain can be lowered compared with a voltage between both electrodes of the display element. Therefore, variations of the driving TFT which affect current that flows to the EL element can be reduced. Accordingly, variations in the deterioration of the TFT do not easily affect variations in brightness of the display element.

However, even when the driving TFT operates in a linear region, an effect due to variations in the crystallinity in a plane of a substrate cannot be ignored when amorphous silicon, microcrystalline silicon, polycrystalline silicon, or the like is used as the semiconductor layer of the TFT.

Thus, it is preferable that the area of the channel formation region of the driving TFT be increased in order to suppress variations of the driving TFT. That is, a channel length and a channel width are preferably increased.

In addition, the longer the channel width is, the lower the voltage between the source and the drain can be made. Furthermore, the shorter the channel length is, the lower the voltage between the source and the drain can be made. Therefore, the channel width is preferably longer than the channel length.

Thus, when the TFT operates in a linear region, it is preferable that the channel width be increased in order to increase the area of the channel formation region of the driving TFT.

Here, in general, by increasing the area of the channel formation region, the aperture ratio of the display device tends to decrease. That is, when variations in the characteristics of the TFT are reduced, the aperture ratio decreases. Namely, in general, it is very difficult to reduce variations in the characteristics of the TFT and to increase the aperture ratio at the same time. This becomes apparent especially when the area of the channel formation region of the TFT with the multi-gate structure is increased, as in this embodiment mode.

However, by using the structure of this embodiment mode, variations in the characteristics of the TFT can be reduced and the aperture ratio can be increased at the same time.

In addition, increasing the aperture ratio leads to a decrease in power consumption and an improvement in the reliability of the display element. That is to say, this is because the required brightness can be obtained at a lower current (or voltage) when the aperture ratio is large, in the case where constant brightness is required. When current (or voltage) which is supplied to the display element is low, the deterioration rate of the display element is reduced.

In addition, the deterioration rate of the display element also varies from display element to display element. Therefore, when the aperture ratio is increased and the deterioration rate of the display device is decreased, variations in the deterioration of brightness of the display element can be reduced, as well. Thus, by the synergistic effect of a reduction in variations in the characteristics of the TFT and a reduction in variations due to an improvement in the aperture ratio, the visibility of the display device can be increased.

Note that off-current of the TFT can be reduced by a TFT with a multi-gate structure. Accordingly, even when a semiconductor of a TFT is non-single crystal or a single crystal, it is preferable to use the TFT with the multi-gate structure.

In addition, as in this embodiment mode, both the driving transistor and the switching transistor connected to the driving transistor are arranged under the wiring (the signal line or the power supply line), a channel length direction of the switching transistor is arranged perpendicular to a channel length direction of the driving transistor, and a channel width direction of the driving transistor is set as a direction in which current flows through the wiring. Thus, the aperture ratio can be increased.

Embodiment Mode 2

In this embodiment mode, the meaning of "a longitudinal direction of a wiring" will be specifically described with reference to FIGS. 5, 6, and 7.

The "longitudinal direction of the wiring" ("channel width direction") is the above-described "direction parallel to the direction in which current flows through the wiring arranged over the channel formation region." Note that, in the case of a wiring having a zigzag shape or a wiring having a meander shape to be described later, current does not necessarily flow in a linear direction in the wiring. In this case, the "longitudinal direction of the wiring" ("channel width direction") is a "direction approximately parallel to the direction in which current flows through a wiring region that is arranged over the channel formation region."

Figure 5:
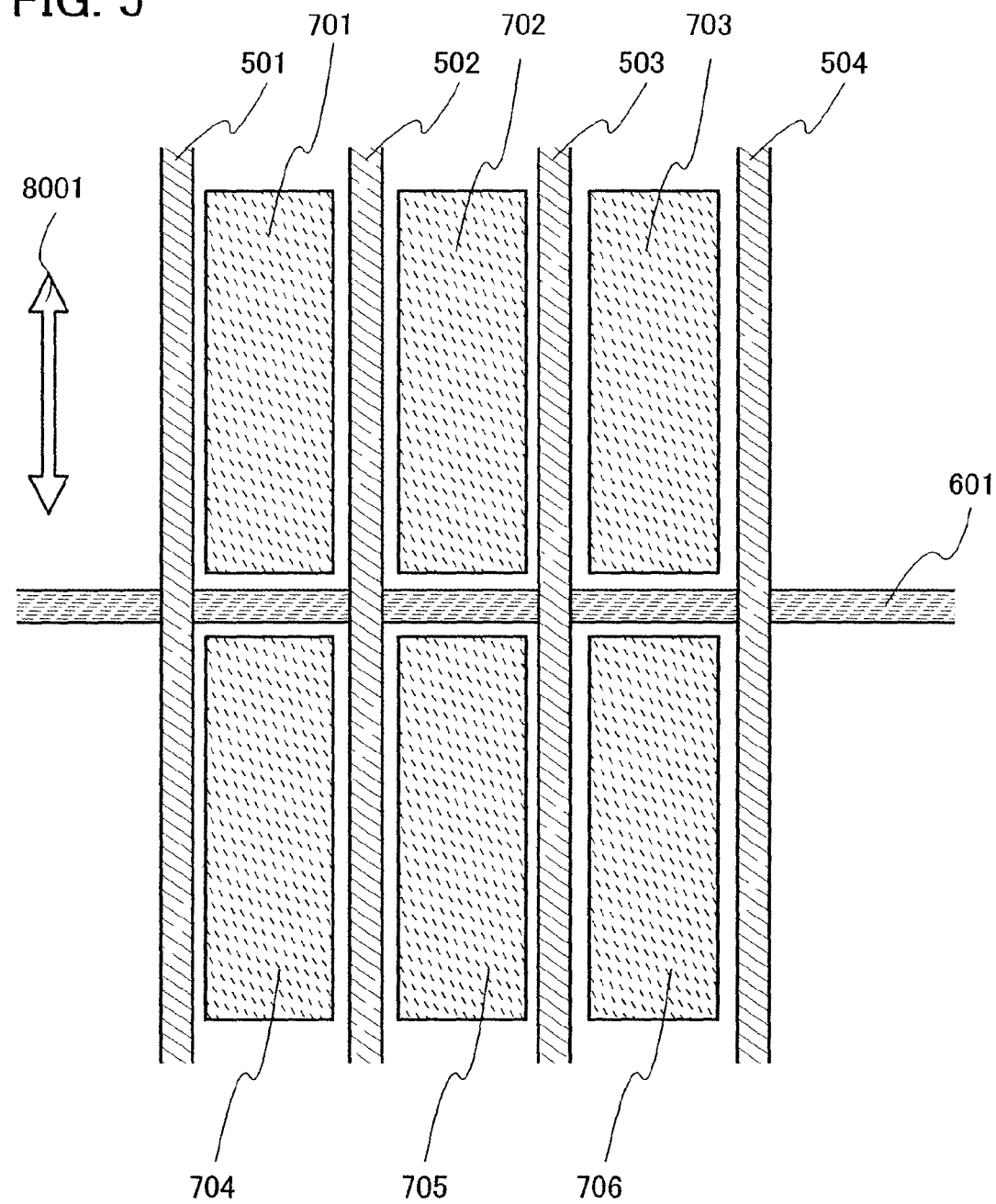
FIG. 5 is a diagram of a pixel electrode and a wiring (wiring shape: straight line).

Here, the shape of the wiring need is not necessarily a straight line as shown in FIG. 5. For example, as shown in FIG. 6, the shape of the wiring may be a zigzag shape, as first wirings 501 and 502. In addition, as shown in FIG. 7, the shape of the wiring may be a meander shape, as the first wirings 501 and 502.

Figure 6:
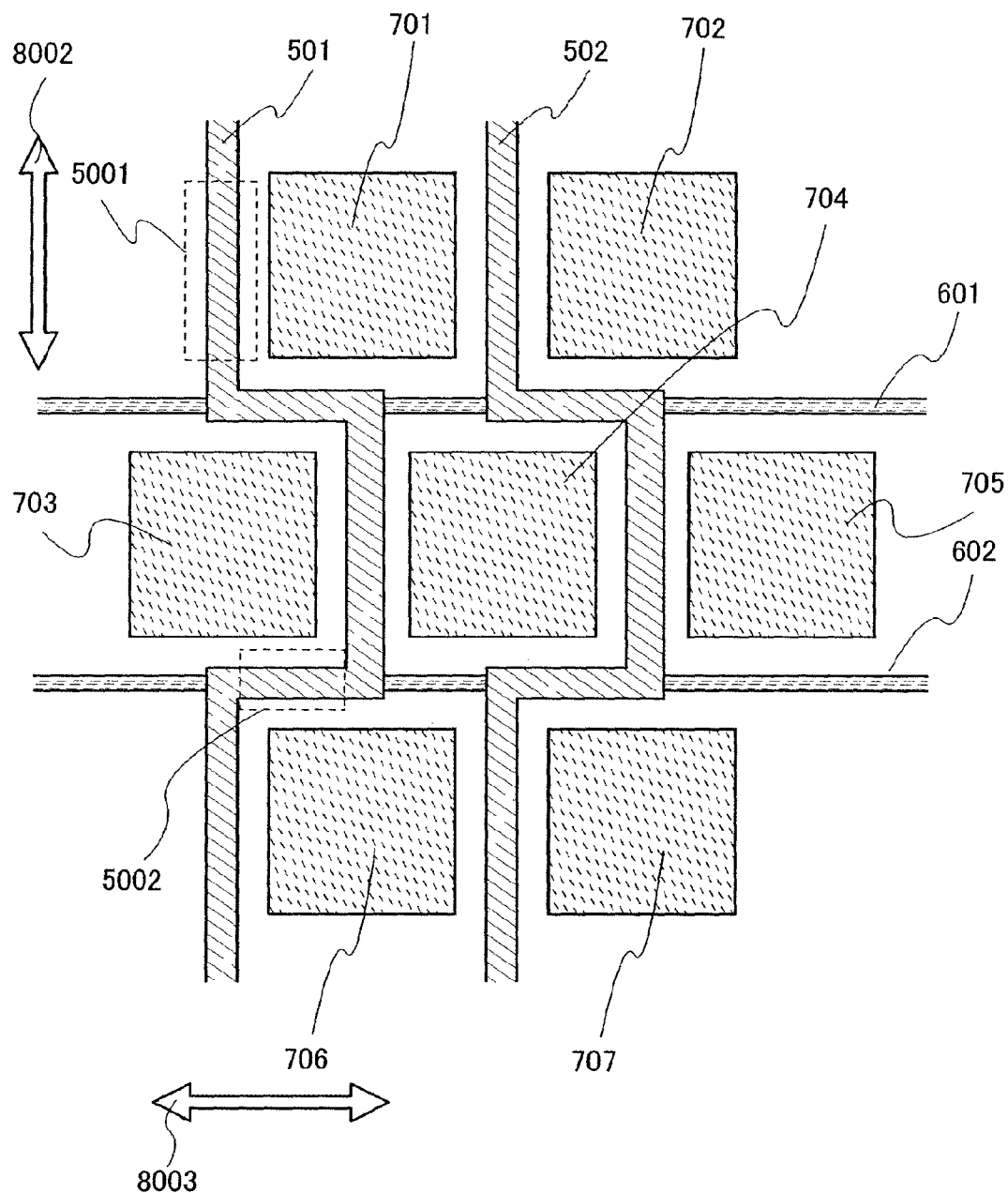
FIG. 6 is a diagram of a pixel electrode and a wiring (wiring shape: zigzag).
Figure 7:
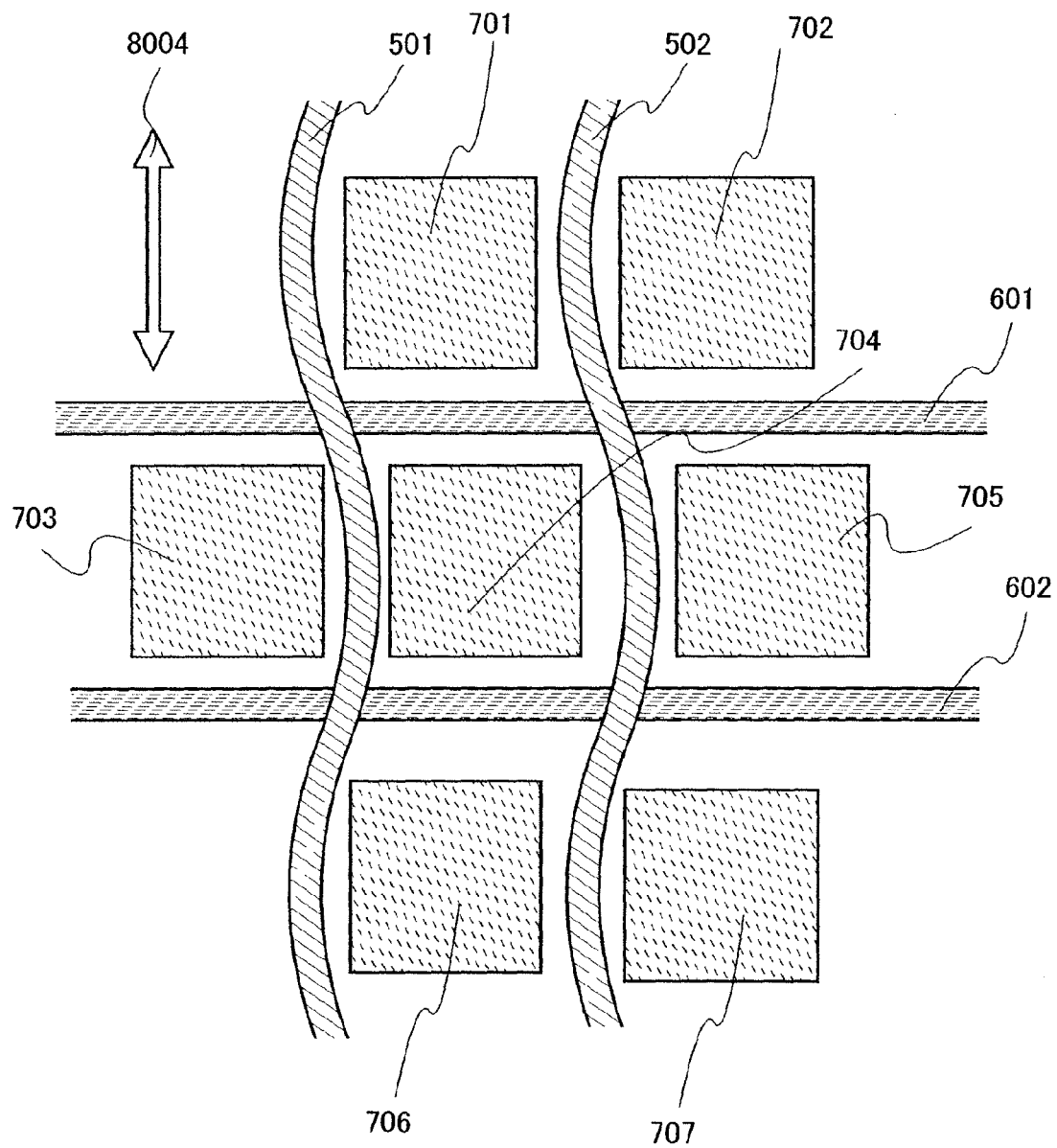
FIG. 7 is a diagram of a pixel electrode and a wiring (wiring shape: meandering).

Note that FIGS. 5, 6, and 7 each show a schematic diagram showing arrangement of wirings and pixel electrodes. Therefore, a TFT is not illustrated. Reference numerals 501 to 504 are first wirings; 601 and 602 are second wirings; and 701 to 707 are pixel electrodes. Note that one of the first wiring and the second wiring is a source signal line, and the other thereof is a power supply line.

The zigzag shape is a shape having a line that proceeds by sharp turns in alternating directions. "Meander" means to follow a winding or intricate course. In addition, the meander shape has such a shape.

As shown in FIG. 5, when the first wirings 501 to 504 and the second wiring 601 each have a linear shape, the "longitudinal direction of the wiring (a first arrow 8001 of FIG. 5)" is a direction parallel to a "direction (the first arrow 8001 of FIG. 5) in which current flows through the first wiring arranged over the channel formation region."

When the wiring has a zigzag shape as shown in FIG. 6, for example, a TFT is arranged under a first wiring region 5001 of FIG. 6. In this case, the "longitudinal direction of the wiring (a second arrow 8002 of FIG. 6)" is a direction parallel to a "direction (the second arrow 8002 of FIG. 6) in which current flows through the wiring arranged over the channel formation region."

On the other hand, when the TFT is arranged under a second wiring region 5002 of FIG. 6, for example, the "longitudinal direction of the wiring (a third arrow 8003 of FIG. 6)" is a direction parallel to a "direction (the third arrow 8003 of FIG. 6) in which current flows through the wiring arranged over the channel formation region."

In addition, even when the wiring has a meander shape as shown in FIG. 7, current flows along the shape of the wiring. Therefore, there is a portion in which current flows in a direction which is not parallel to the longitudinal direction of the wiring. However, finally, electrons flow in a direction parallel to the longitudinal direction of the wiring (a fourth arrow 8004 of FIG. 7). Accordingly, in the case of using a wiring having such a shape, the channel width direction is the "direction approximately parallel to the direction in which current flows in the wiring region arranged over the channel formation region" or the "direction parallel to the longitudinal direction of the wiring."

With the above-described structure, the wiring can be arranged in the narrow space between the pixel electrodes (in the space between adjacent pixel electrodes). In addition, as large a TFT as will fit (specifically, a TFT with a large channel width) can be placed under the wiring. Therefore, the aperture ratio can be increased.

Embodiment Mode 3

In this embodiment mode, another variation of a layout of a driving transistor of the present invention will be exemplified. Note that the present invention is not limited to the layout exemplified in this embodiment mode.

Figure 8:
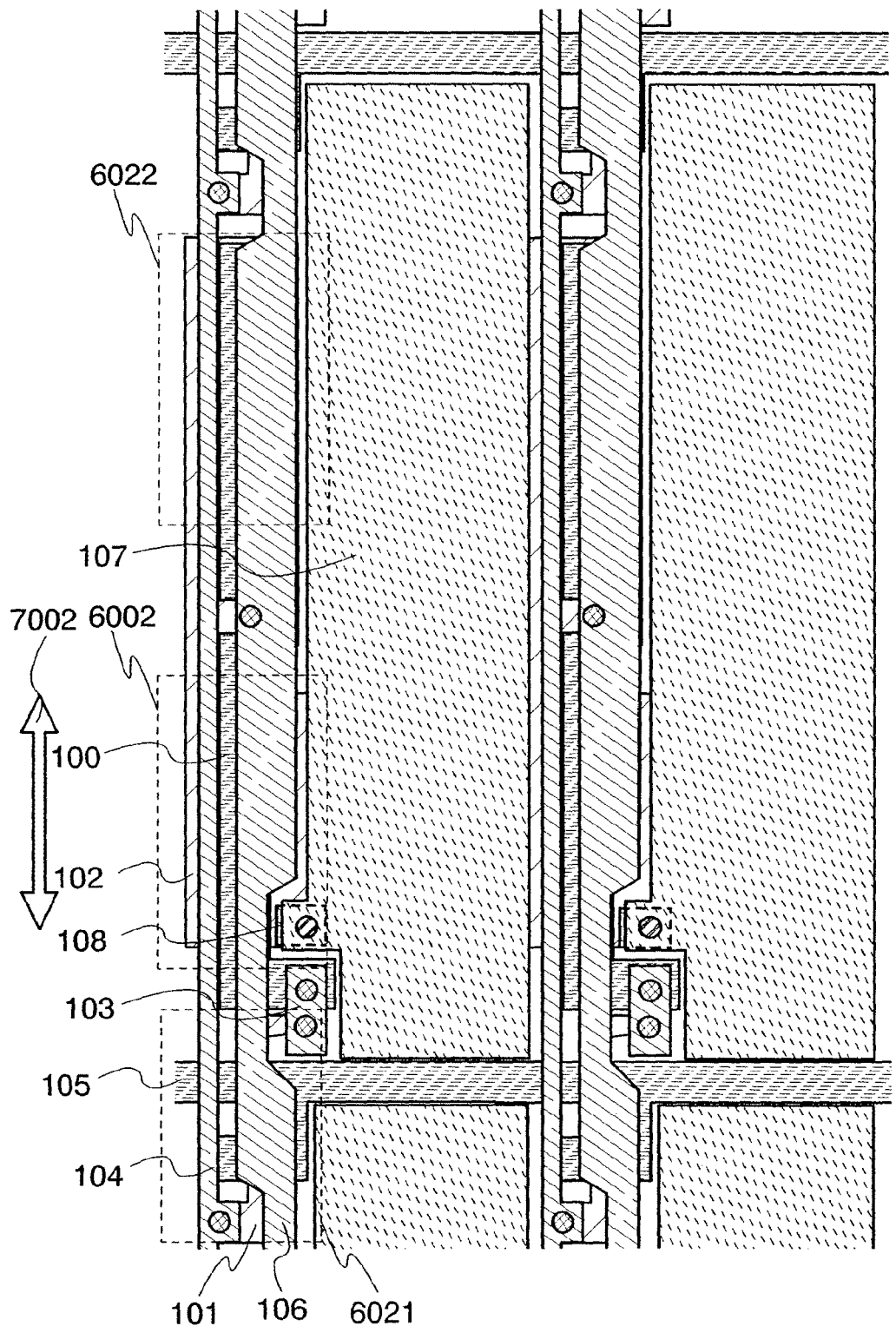
FIG. 8 is a layout 1 of a single-gate structure.

FIG. 8 shows a layout of a single-gate structure. The first semiconductor layer 101 is an island-shaped semiconductor layer of a switching TFT. A region that overlaps with the gate wiring 105 is a channel formation region. A region that is connected to the signal line 104 through a contact hole is a source terminal (or a drain terminal). A region that is connected to the connection electrode 103 is the drain terminal (or the source terminal).

Further, the second semiconductor layer 102 is the island-shaped semiconductor layer of the driving TFT 301 that drives the display element. In addition, a region that overlaps with the gate electrode 100 is a channel formation region. The gate electrode of the driving TFT 301 is connected to the connection electrode 103 through a contact hole. Furthermore, the source terminal (or the drain terminal) of the driving TFT 301 and the power supply line 106 are connected to each other. The drain terminal (or the source terminal) of the driving TFT 301 and the connection electrode 108 are connected to each other through a contact hole. In addition, the pixel electrode 107 is formed in contact with the connection electrode 108.

Note that a correspondence relation between FIGS. 8 and 3 is as follows.

A portion encircled by a dashed line portion 6002 corresponds to the driving TFT 301.

A portion encircled by a dashed line portion 6021 corresponds to the switching TFT 302.

A portion encircled by a dashed line portion 6022 corresponds to the capacitor 300.

The pixel electrode 107 corresponds to the pixel electrode of the display element 303.

The signal line 104 corresponds to the signal line 304.

The power supply line 106 corresponds to the power supply line 306.

Figure 9:
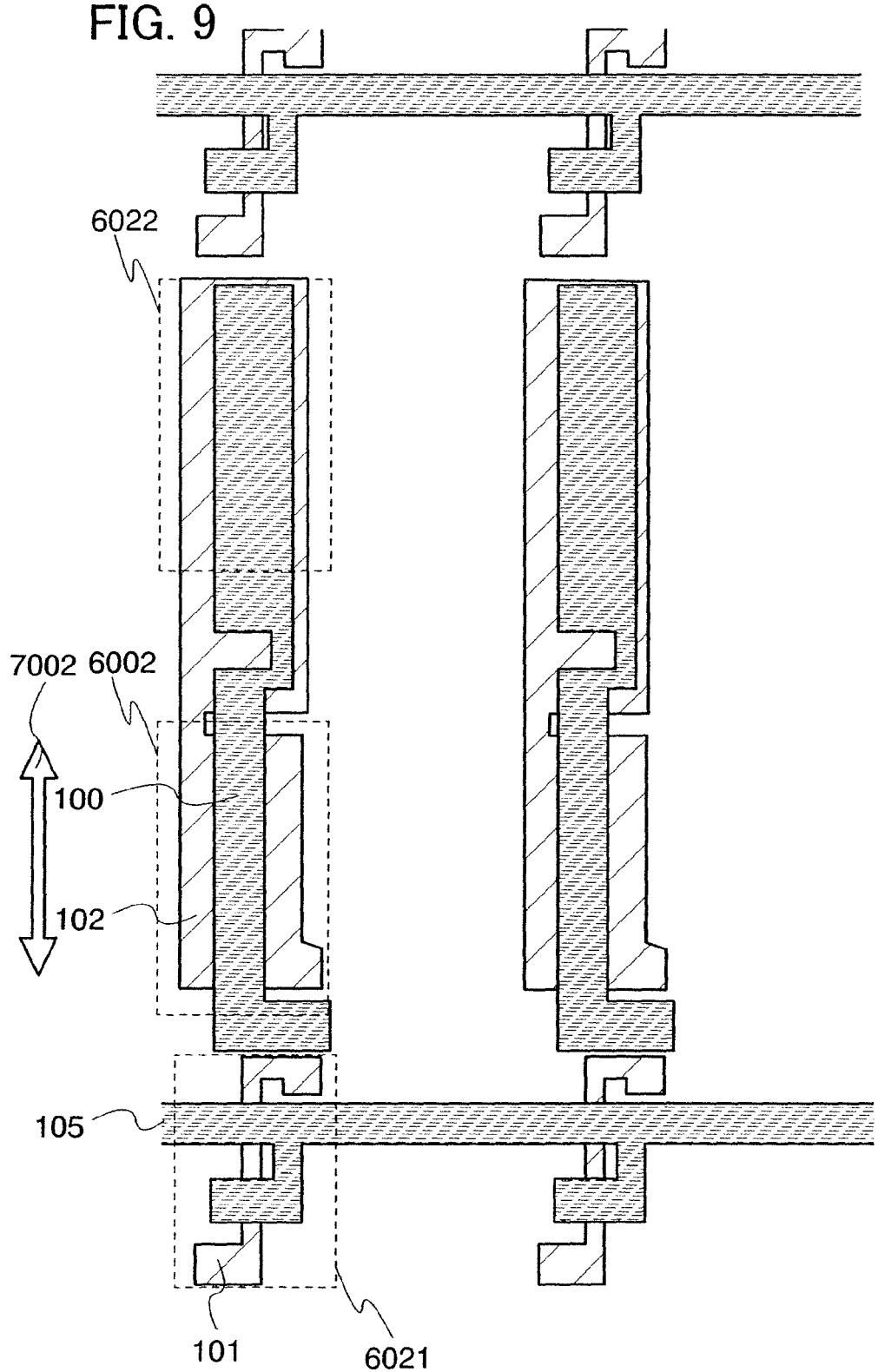
FIG. 9 is a layout 2 of a single-gate structure.

In addition, FIG. 9 is a top view corresponding to FIG. 8 and a diagram of a stage in which the first semiconductor layer 101, the second semiconductor layer 102, the gate wiring 105, and the gate electrode 100 are formed.

Patterning is performed such that an impurity region of the semiconductor layer is parallel to a longitudinal direction of the pixel electrode (or a direction in which current flows through the wiring or a longitudinal direction of the wiring) (the dashed line portion 6002 in FIGS. 8 and 9). Thus, a channel width direction can be arranged parallel to the longitudinal direction of the pixel electrode (an arrow 7002 in FIGS. 8 and 9).

Figure 10:
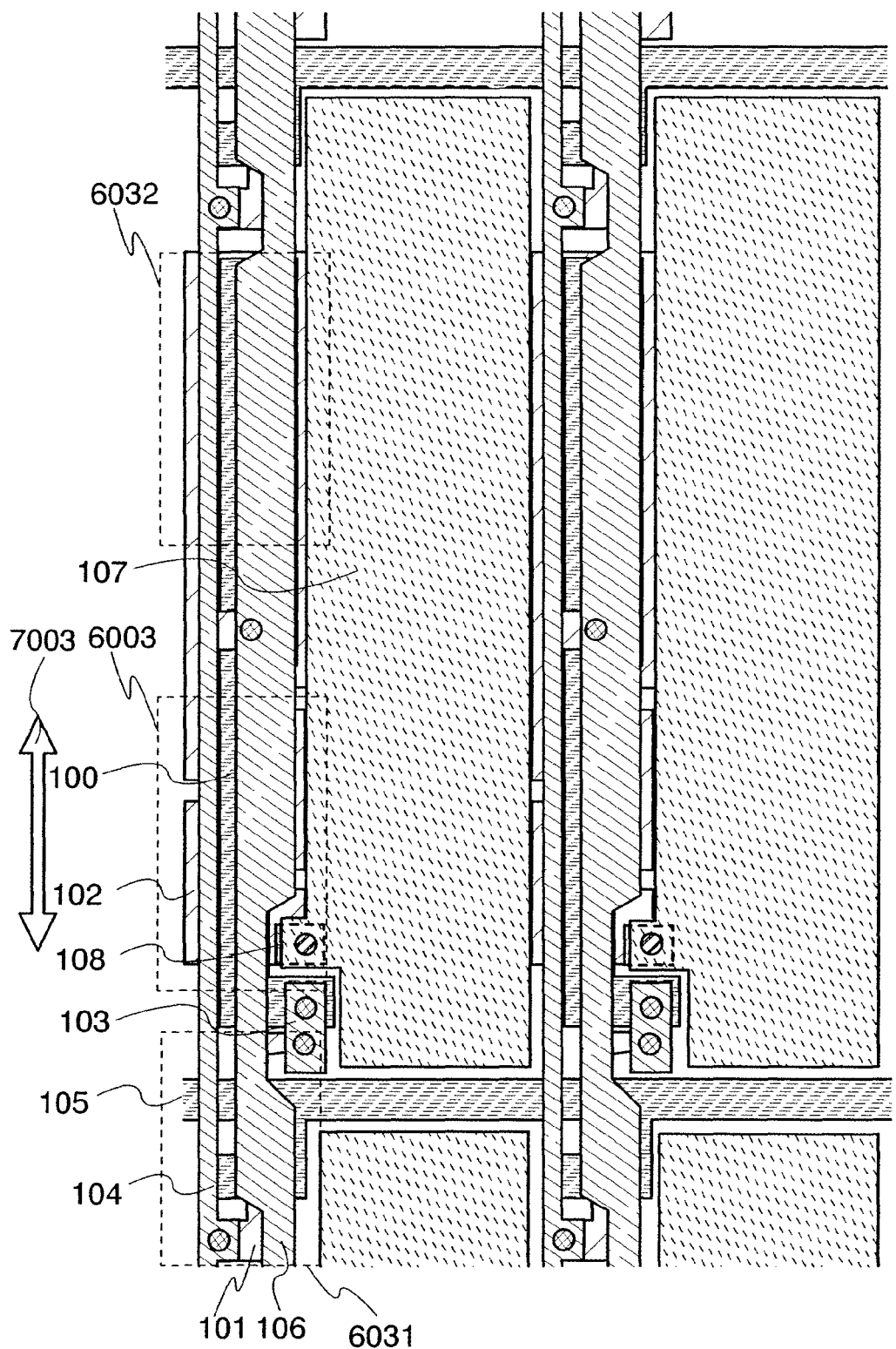
FIG. 10 is a layout 1 of a triple-gate structure.

FIG. 10 shows a layout of a triple-gate structure. The first semiconductor layer 101 is an island-shaped semiconductor layer of a switching TFT. A region that overlaps with the gate wiring 105 is a channel formation region. A region that is connected to the signal line 104 is a source terminal (or a drain terminal). A region that is connected to the connection electrode 103 through a contact hole is the drain terminal (or the source terminal).

Further, the second semiconductor layer 102 is the island-shaped semiconductor layer of the driving TFT 301 that drives the display element. In addition, a region that overlaps with the gate electrode 100 is a channel formation region. The gate electrode of the driving TFT 301 is connected to the connection electrode 103. Furthermore, the source terminal (or the drain terminal) of the driving TFT 301 and the power supply line 106 are connected to each other through a contact hole. The drain terminal (or the source terminal) of the driving TFT 301 and the connection electrode 108 are connected to each other through a contact hole. In addition, the pixel electrode 107 is formed in contact with the connection electrode 108.

Note that a correspondence relation between FIGS. 10 and 3 is as follows.

A portion encircled by a dashed line portion 6003 corresponds to the driving TFT 301.

A portion encircled by a dashed line portion 6031 corresponds to the switching TFT 302.

A portion encircled by a dashed line portion 6032 corresponds to the capacitor 300.

The pixel electrode 107 corresponds to the pixel electrode of the display element 303.

The signal line 104 corresponds to the signal line 304.

The power supply line 106 corresponds to the power supply line 306.

Figure 11:
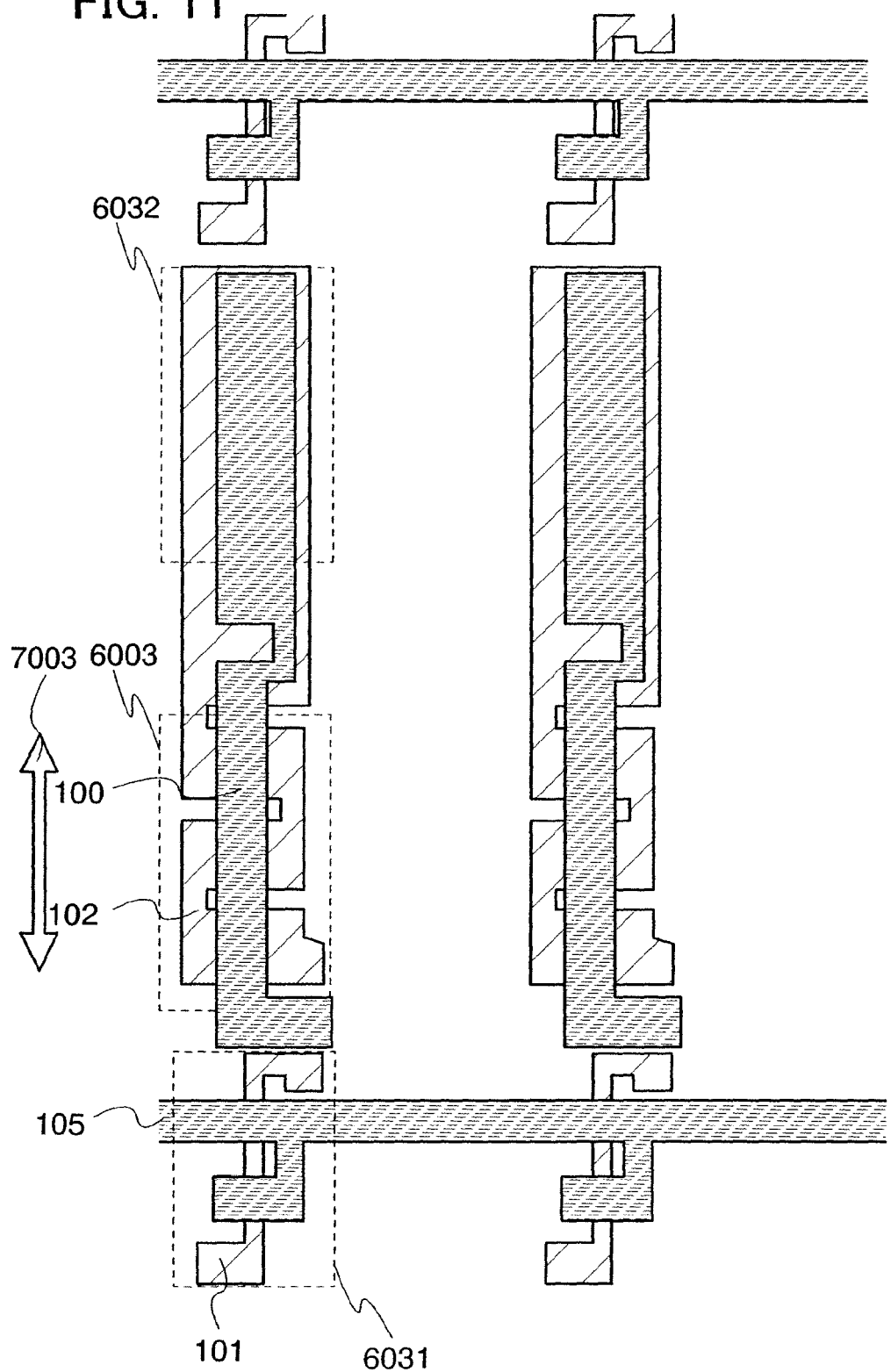
FIG. 11 is a layout 2 of a triple-gate structure.

In addition, FIG. 11 is a top view corresponding to FIG. 10 and a diagram of a stage in which the first semiconductor layer 101, the second semiconductor layer 102, the gate wiring 105, and the gate electrode 100 are formed.

Patterning is performed such that an impurity region of a semiconductor layer is parallel to a longitudinal direction of a pixel electrode (or a direction in which current flows through the wiring or a longitudinal direction of the wiring) (e.g., S-shape) (the dashed line portion 6003 in FIGS. 10 and 11). Accordingly, a channel width direction can be arranged parallel to the longitudinal direction of the pixel electrode (an arrow 7003 in FIGS. 10 and 11).

In this embodiment mode, the layout of the TFT with one channel formation region and the layout of the TFT with three channel formation regions are described. In addition, the layout of the TFT with two channel formation regions is described in Embodiment Mode 1. However, the structure of the present invention is not limited to the structures of these embodiment modes and a TFT with four or more channel formation regions can also be used.

Embodiment Mode 4

The present invention is not limited to a pixel including two TFTs. In the case of using a pixel structure having a driving TFT of a double-gate structure of L<W, the present invention can be used as appropriate so as to make arrangement such that the aperture ratio is increased, a simple opening shape is made, and a channel width is increased.

Embodiment Mode 5

In this embodiment mode, a manufacturing process of a display device will be described. Note that in description, only a pixel portion is described; however, a manufacturing process of a driver circuit portion is not limited to this, and description thereof is omitted here.

Figure 4A:
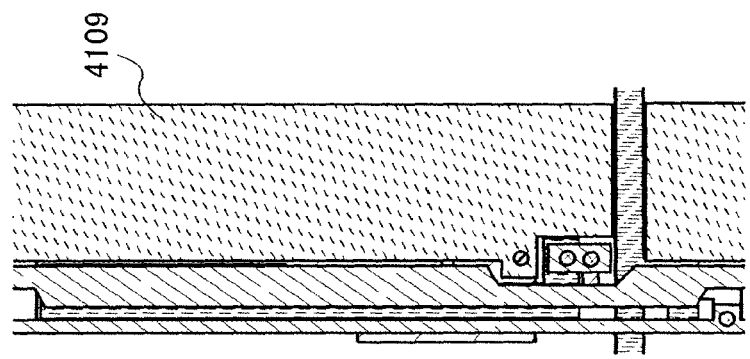
FIGS. 4A to 4D show the flow of manufacturing of a TFT (top views).

A base film formed of a silicon oxide film, a silicon nitride film, or a silicon oxynitride film is formed over a substrate formed of glass such as barium borosilicate glass or alumino borosilicate glass, as shown in FIG. 4A. Then, a semiconductor film having an amorphous structure is crystallized by using a laser crystallization method or a known thermal crystallization method, and the crystalline semiconductor film is patterned into a desired shape to obtain island-shaped semiconductor layers 4101 and 4102. Note that the base film and the semiconductor film can be formed by a known film formation method (e.g., a CVD method, a PVD method, or the like).

Note that, here, a polycrystalline silicon film is used by crystallizing the semiconductor film. However, in the present invention, amorphous silicon or microcrystalline silicon may be used, as well. In addition, single crystal silicon may be used, as well.

In the case of using single crystal silicon, an SOI substrate (a Silicon On Insulator substrate) in which a thin single crystal silicon layer is arranged on a substrate, or the like may be used.

Here, when an impurity is added to a first region to be a first capacitor portion in the island-shaped semiconductor layer 4101, the first region can function as a first electrode of a first capacitor. Here, boron which imparts p-type conductivity is injected by an ion doping method. Alternatively, an impurity which imparts n-type conductivity may be injected. The impurity which imparts n-type conductivity includes phosphorus, arsenic, and the like. Note that an impurity can be added by a known method (e.g., an ion doping method, an ion shower method, or the like).

Figure 4B:
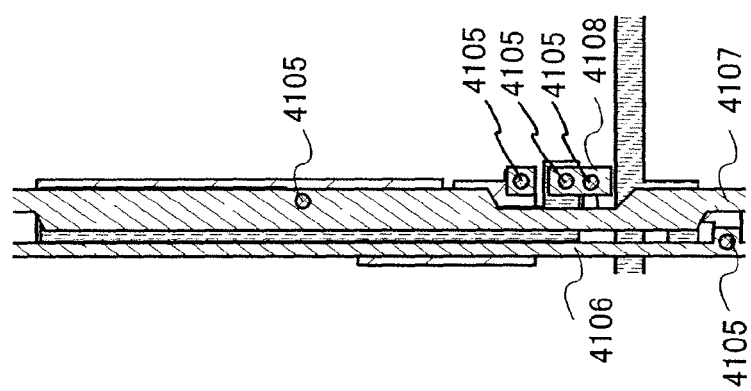

Next, a gate insulating film which covers the island-shaped semiconductor layers 4101 and 4102 is formed. Then, a conductive film for forming a gate electrode is formed by using an element selected from Ta, W, Ti, Mo, Al, Cu, and the like; or an alloy material or a compound material containing the element as a main component. Then, the conductive film is patterned into a desired shape, and gate electrodes 4103 and 4104 (the gate electrode 4104 also serves as a scanning line) are obtained (FIG. 4B).

Next, when an impurity is added to each impurity region of the island-shaped semiconductor layers 4101 and 4102, a source region, a drain region and a channel formation region are formed. Here, boron which imparts p-type conductivity is injected by an ion doping method for forming a p-channel transistor. In the case of forming a n-channel transistor, an impurity which imparts n-type conductivity may be injected. The impurity which imparts n-type conductivity includes phosphorus, arsenic, and the like. Note that an impurity can be added by a known method (e.g., an ion doping method, an ion shower method, or the like). In addition, an LDD region may be formed in a portion that is in contact with a channel formation region.

Next, the added impurity is activated by performing annealing. As an annealing method, a known technique such as furnace anneal or laser anneal may be used. Note that before annealing, a passivation film (e.g. silicon oxide or the like) may be formed by a known method (e.g. a CVD method, a PVD method, or the like) to protect the gate insulating film.

Next, an interlayer insulating film is formed. The interlayer insulating film may be an organic insulating film or an inorganic insulating film. The organic insulating film can be formed of acrylic, polyimide, siloxane, or the like. As a method for forming the organic insulating film, a known method (a spin coating method, a dipping method, or the like) can be used. In addition, the inorganic insulating film can be formed of silicon oxide, silicon nitride, or the like. The inorganic insulating film may be formed by a known method (e.g., a CVD method, a PVD method, or the like). Note that by using a material with a high dielectric constant, such as silicon nitride, capacitance can be increased. On the other hand, in the case of using the organic insulating film, planarization can be achieved.

Note that a planarization process may be performed on the interlayer insulating film by a known technique (e.g., a CMP method).

Figure 4C:
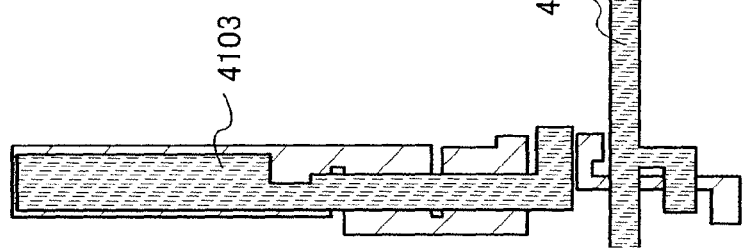

Next, as shown in FIG. 4C, contact holes 4105, which reach the island-shaped semiconductor layers 4101 and 4102 and the gate electrodes 4103 and 4104, are formed. Wirings 4106, 4107, and 4108 (the wiring 4106 serves as a source signal line and the wiring 4107 serves as a power supply line), and an electrode 4110 are formed.

Figure 4D:
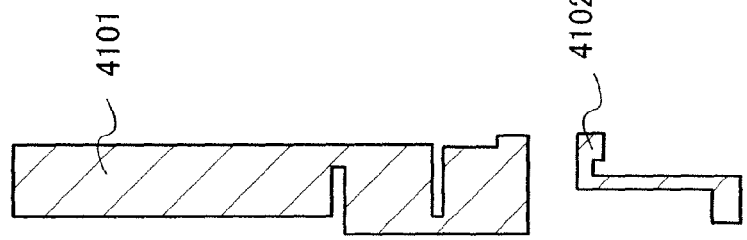

Next, as shown in FIG. 4D, a pixel electrode 4109 is formed. A material of the pixel electrode is typified by indium tin oxide (commonly called "ITO") or the like. After a film formed of the above-described material is formed, the pixel electrode 4109 is patterned to obtain a desired shape, as well. Here, the electrode 4110 and the pixel electrode 4109 are in contact with each other through a contact hole 4105.

Next, a partition wall is formed between adjacent pixels, and a portion to serve as a light-emitting area is opened by patterning. Then, an EL layer is formed in the opening portion.

In this embodiment mode, the method for manufacturing a top gate TFT is described. However, the present invention can be used for a bottom gate TFT.

Embodiment Mode 6

Figure 14A:
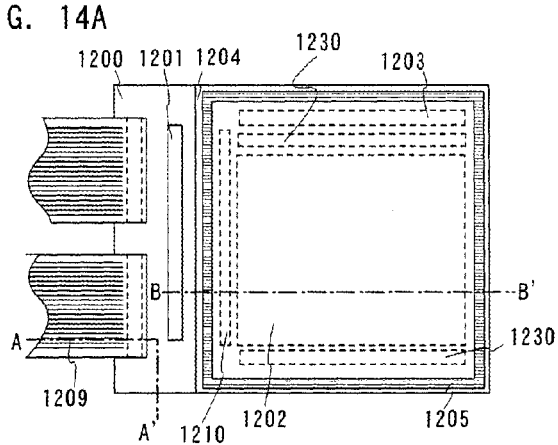
FIG. 14A is a top view of a display device.
Figure 14B:
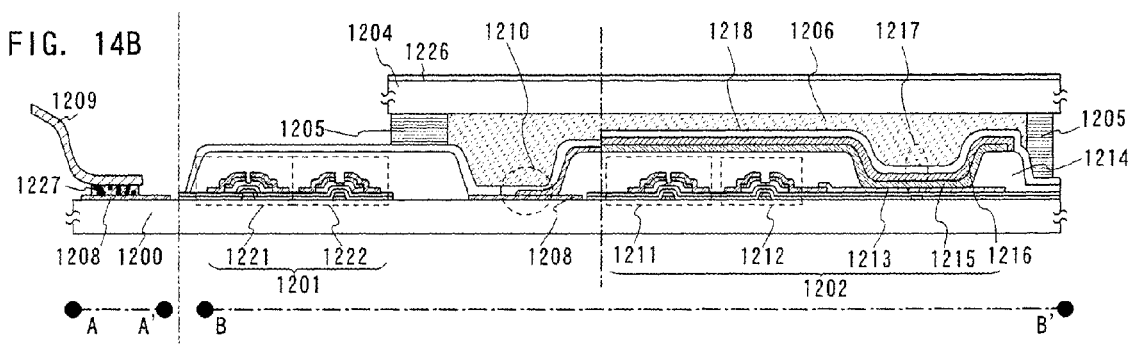
FIG. 14B is a cross-sectional view of the display device.

In this embodiment mode, one example of an external appearance of a light-emitting display panel is described with reference to FIGS. 14A and 14B. FIG. 14A is a top view of a panel which is obtained by sealing a space between a first substrate and a second substrate with a first sealant 1205 and a second sealant 1206. FIG. 14B is a cross-sectional view taken along a line A-A' and a line B-B' in FIG. 14A.

FIG. 14A shows a pixel portion 1202, a monitor element portion 1230, and a scanning line driver circuit (gate line driver circuit) 1203, each of which is indicated by a dotted line. In this embodiment mode, the pixel portion 1202 and the scanning line driver circuit 1203 are located in the region sealed with the first sealant and the second sealant. A reference numeral 1201 denotes a signal line (source line) driver circuit which is provided over a first substrate 1200. As the first sealant, an epoxy resin having high viscosity including a filler is preferably used. On the other hand, the second sealant is preferably an epoxy resin having low viscosity. In addition, the first sealant 1205 and the second sealant 1206 are desirably materials which transmit as little moisture or oxygen as possible.

In addition, a drying agent may be provided between the pixel portion 1202 and the first sealant 1205. Further, a drying agent may be provided over the scanning line or the signal line in the pixel portion. The drying agent is preferably a substance which adsorbs water ($H_2O$) by chemical adsorption such as oxide of alkaline earth metal such as calcium oxide (CaO) or barium oxide (BaO). However, the present invention is not limited to these, and a substance which adsorbs water by physical adsorption such as zeolite or silica gel may alternatively be used.

By using a resin having high moisture permeability and including a particulate drying agent as an interlayer insulating film, the interlayer insulating film may be fixed to a second substrate 1204 by a sealant. As substitute for the resin having high moisture permeability, an inorganic substance such as phosphosilicate glass (PSG), or borophosphosilicate glass (BPSG) can alternatively be used.

In addition, a drying agent may be provided in a region that overlaps with the scanning line. Furthermore, by using a resin having high moisture permeability and including a particulate drying agent as an interlayer insulating film, the interlayer insulating film may be fixed to the second substrate 1204 by a sealant. By providing these drying agents, intrusion of moisture into a display element and deterioration resulting therefrom can be suppressed without decreasing the aperture ratio. Therefore, variation in deterioration of the display elements in the peripheral portion and the center portion of the pixel portion 1202 can be suppressed.

Note that a connection wiring 1210 is a connection wiring for transmitting a signal inputted to the signal line driver circuit 1201 and the scanning line driver circuit 1203 and receiving a video signal or a clock signal from an FPC (Flexible Printed Circuit) 1209 which serves as an external input terminal through a connection wiring 1208.

Next, a cross-sectional structure is described with reference to FIG. 14B. Over the first substrate 1200, a driver circuit and a pixel portion are formed, which include a plurality of semiconductor elements typified by a TFT. The signal line driver circuit 1201 as the driver circuit and the pixel portion 1202 are shown. Note that the signal line driver circuit 1201 has a CMOS circuit including both an n-channel TFT 1221 and a p-channel TFT 1222.

Since the scanning line driver circuit and the TFT in the pixel portion are formed over one substrate in this embodiment mode, the volume of the light-emitting display device can be decreased.

The pixel portion 1202 includes a plurality of pixels each including a switching TFT 1211, a driving TFT 1212, and a first pixel electrode (anode) 1213 formed of a reflective conductive film which is electrically connected to either one of a drain or source of the driving TFT 1212.

In addition, an insulator 1214 (also referred to as a bank, partition wall, barrier, mound, or the like) is formed on opposite ends of the first pixel electrode (anode) 1213. In order to enhance the coverage of a film formed over the insulator 1214, the insulator 1214 is formed to have a curved surface having curvature on the top end or the bottom end. Further, the surface of the insulator 1214 may be covered with a protective film formed of an aluminum nitride film, an aluminum nitride oxide film, a thin film including carbon as a main component, or a silicon nitride film. In addition, if an organic material in which a material which absorbs visible light such as a black colorant or pigment is dissolved or dispersed is used for the insulator 1214, the stray light of a display element to be formed later can be absorbed. Therefore, contrast of each pixel can be improved. In the present invention, a scanning line, a signal line, and a TFT are arranged under the insulator. In addition, a TFT is arranged under the scanning line or the signal line. In the case where the TFT is arranged under the scanning line, a longitudinal direction of the scanning line (or a direction in which current flows) is arranged parallel to a channel width direction of the TFT. In the case where the TFT is arranged under the signal line, a longitudinal direction of the signal line (or a direction in which current flows) is arranged parallel to the channel width direction of the TFT.

An electroluminescent layer 1215 is selectively formed over the first pixel electrode (anode) 1213 by evaporating an organic compound material. In addition, a second pixel electrode (cathode) 1216 is formed over the electroluminescent layer 1215.

In this manner, a display element 1217 including the first pixel electrode (anode) 1213, the electroluminescent layer 1215, and the second pixel electrode (cathode) 1216 is formed. The display element 1217 emits light to the second substrate 1204 side.

In addition, a protective stacked layer 1218 is formed in order to seal the display element 1217. The protective stacked layer 1218 has a stack of a first inorganic insulating film, a stress relaxation film, and a second inorganic insulating film. Then, the protective stacked layer 1218 is attached to the second substrate 1204 with the first sealant 1205 and the second sealant 1206. Note that the second sealant is preferably dropped using a device for dropping a sealant. After dropping or discharging the sealant from a dispenser and forming the sealant to an active matrix substrate, the second substrate is attached to the active matrix substrate in vacuum and ultraviolet curing is performed; thereby sealing can be performed.

An antireflection film 1226 for preventing external light from reflecting off a substrate surface is provided for the surface of the second substrate 1204. Either or both of a polarizing plate and a retardation plate may be provided between the second substrate and the antireflection film. By providing a retardation plate or a polarizing plate, external light can be prevented from reflecting off the pixel electrode. Note that if the first pixel electrode 1213 and the second pixel electrode 1216 are formed using a light-transmitting conductive film or a semi-light-transmitting conductive film, and the interlayer insulating film is formed of a material which absorbs visible light or an organic material in which a material which absorbs visible light is dissolved or dispersed; each pixel electrode does not reflect external light; therefore, the retardation plate and the polarizing plate are not necessarily provided.

The connection wiring 1208 and the FPC 1209 are electrically connected to each other through an anisotropic conductive film or an anisotropic conductive resin 1227. Further, it is preferable that a connecting portion between each wiring layer and a connecting terminal be sealed with a sealing resin. With such a structure, moisture can be prevented from entering the display element from the cross-sectional portion and deterioration can be prevented.

Note that the space between the second substrate 1204 and the protective stacked layer 1218 may be filled with an inert gas such as nitrogen gas, instead of the second sealant 1206, so that deterioration can be prevented.

In addition, a colored layer may be provided between the second substrate and the polarizing plate. In this case, full color display can be performed by providing display elements capable of white light emission in the pixel portion and additionally providing colored layers of RGB. Alternatively, full color display can be performed by providing display elements capable of blue light emission in the pixel portion and additionally providing a color conversion layer or the like. Further alternatively, display elements which emit red, green, and blue light formed in the pixel portion and the colored layer may be used. Such a display module has high color purity of RGB, and is capable of displaying high-resolution images.

In addition, a light-emitting display module may be formed using a substrate formed of a film, a resin, or the like as one or both of the first substrate 1200 and the second substrate 1204. If the substrate formed of a film, resin, or the like is used in such a manner, weight saving, downsizing, and thinning of the display device can be achieved.

Furthermore, the light-emitting display module may be formed by providing an IC chip such as a controller, a memory, and a pixel driver circuit for the surface or at the end of the FPC (Flexible Printed Circuit) 1209 to serve as an external input terminal.

Embodiment Mode 7

A light-emitting element means an element (OLED element) having a structure in which an organic compound layer which emits light when an electric field is generated is interposed between an anode and a cathode; however, the present invention is not limited to this.

In addition, the light-emitting element means both an element that utilizes light (fluorescence) emitted when making a transition from a singlet exciton to a base state, and an element that utilizes light (phosphorescence) emitted when making a transition from a triplet exciton to a base state.

As an organic compound layer, there are a hole injecting layer, a hole transporting layer, a light-emitting layer, an electron transporting layer, an electron injecting layer, and the like. The basic structure of a light-emitting element is a stack of an anode, a light-emitting layer, and a cathode in this order. Other than this, there are a structure of stacking an anode, a hole injecting layer, a light-emitting layer, an electron injecting layer, and a cathode in this order, a structure of stacking an anode, a hole injecting layer, a hole transporting layer, a light-emitting layer, an electron transporting layer, an electron injecting layer, and a cathode in this order, and the like.

Note that the organic compound layer is not limited to a layer having a stacked structure in which the hole injecting layer, the hole transporting layer, the light-emitting layer, the electron transporting layer, the electron injecting layer, and the like are clearly distinguished. That is, the organic compound layer may have a structure including a layer in which respective materials forming the hole injecting layer, the hole transporting layer, the light-emitting layer, the electron transporting layer, the electron injecting layer, or the like are mixed.

Further, an inorganic material may be mixed, as well.

Further, any material of a low molecular material, a high molecular material, and a medium molecular material can be used for the organic compound layer of an OLED element.

Note that in this specification, a medium molecular material does not have the sublimation property, and a molecular chain length thereof is 10 μm or less.

Embodiment Mode 8

Another structure applicable to the display element of the present invention is described with reference to FIGS. 12A to 12C and 13A to 13C.

Light emitting elements (display elements) utilizing electroluminescence are classified according to whether a light emitting material is an organic compound or an inorganic compound. In general, the former is referred to as an organic EL element, and the latter is referred to as an inorganic EL element.

The inorganic EL elements are classified according to their element structures into a dispersed inorganic EL element and a thin-film inorganic EL element. They are different in that the former includes an electroluminescent layer in which particles of a light emitting material are dispersed in a binder and the latter includes an electroluminescent layer formed of a thin film of a light emitting material; however, they are common in that electrons accelerated by a high electric field are required. Note that a mechanism for obtainable light emission includes a donor-acceptor recombination light emission which utilizes a donor level and an acceptor level and a localized light emission which utilizes inner-shell electron transition of metal ions. In general, it is often the case that the dispersed inorganic EL element performs the donor-acceptor recombination light emission and the thin-film inorganic EL element performs the localized light emission.

A light emitting material which can be used in the present invention includes a base material and an impurity element serving as a light emitting center. Light emission of various colors can be obtained by changing impurity elements to be contained. As a method for producing a light emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a combined method of one of these methods and high-temperature baking, or a freeze-drying method can be used.

The solid phase method is a method by which a base material and an impurity element or a compound containing an impurity element are weighed, mixed in a mortar, and reacted by heating and baking in an electric furnace to make the impurity element contained in the base material. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form. The method requires baking at a relatively high temperature; however, it is a simple method. Therefore, the method provides good productivity and is suitable for mass production.

The liquid phase method (coprecipitation method) is a method by which a base material or a compound containing a base material is reacted in a solution with an impurity element or a compound containing an impurity element and the reactant is baked after being dried. Particles of the light emitting material are uniformly distributed; a particle size is small; and the reaction proceeds even at a low baking temperature.

As the base material used for a light emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Further, zinc selenide (ZnSe), zinc telluride (ZnTe), or the like can also be used. It may be a ternary mixed crystal such as calcium gallium sulfide ($CaGa_2S_4$), strontium gallium sulfide ($SrGa_2S_4$), barium gallium sulfide ($BaGa_2S_4$), or the like.

As the light emitting center of localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as charge compensation.

On the other hand, as the light emitting center of donor-acceptor recombination light emission, a light emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In the case of synthesizing the light emitting material of donor-acceptor recombination light emission by a solid phase method, a base material, a first impurity element or a compound containing a first impurity element, and a second impurity element or a compound containing a second impurity element are separately weighed, mixed in a mortar, and then heated and baked in an electric furnace. As the base material, the above-mentioned base material can be used. As the first impurity element, fluorine (F), chlorine (Cl), or the like can be used, for example. As the compound containing the first impurity element, aluminum sulfide ($Al_2S_3$) or the like can be used, for example. As the second impurity element, copper (Cu), silver (Ag), or the like can be used, for example. As the compound containing the second impurity element, copper sulfide ($Cu_2S$), silver sulfide ($Ag_2S$), or the like can be used, for example. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form.

As the impurity element in the case of utilizing solid phase reaction, a compound including the first impurity element and the second impurity element may be used. In this case, the impurity element is easily diffused and the solid phase reaction easily proceeds, so that a uniform light emitting material can be obtained. Furthermore, a high-purity light emitting material can be obtained since an unnecessary impurity element is not mixed. As the compound including the first impurity element and the second impurity element, copper chloride (CuCl), silver chloride (AgCl), or the like can be used, for example.

Note that the concentration of the impurity element to the base material may be in the range of 0.01 atomic % to 10 atomic %, preferably 0.05 atomic % to 5 atomic %.

In the case of the thin-film inorganic EL element, the electroluminescent layer is a layer containing the above-described light emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an metal organic CVD method or a low-pressure hydride transfer CVD, an atomic layer epitaxy (ALE) method, or the like.

Figure 12A:
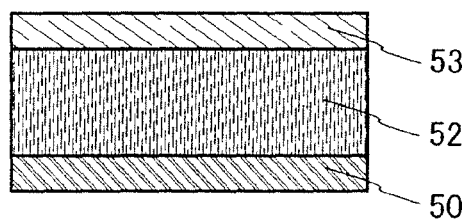
FIGS. 12A to 12C are each a cross-sectional view 1 of an inorganic EL element.
Figure 12B:
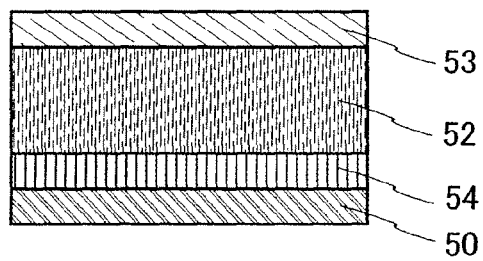
Figure 12C:
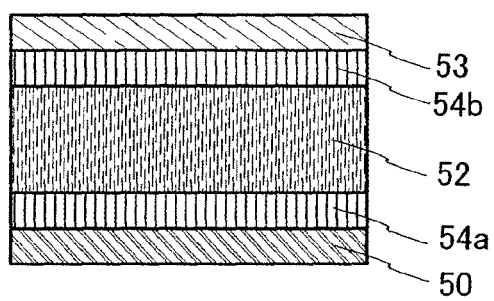

FIGS. 12A to 12C each show an example of a thin-film inorganic EL element which can be used as a display element. In each of FIGS. 12A to 12C, a display element includes a first electrode layer 50, an electroluminescent layer 52, and a second electrode layer 53.

Each of the display elements shown in FIGS. 12B and 12C has a structure in which an insulating layer is provided between the electrode layer and the electroluminescent layer in the display element in FIG. 12A. The display element shown in FIG. 12B includes an insulating layer 54 between the first electrode layer 50 and the electroluminescent layer 52. The display element shown in FIG. 12C includes an insulating layer 54a between the first electrode layer 50 and the electroluminescent layer 52 and an insulating layer 54b between the second electrode layer 53 and the electroluminescent layer 52. As described above, the insulating layer may be provided between the electroluminescent layer and either or both of the pair of electrode layers sandwiching the electroluminescent layer. The insulating layer may be a single layer or a stack of a plurality of layers.

In FIG. 12B, the insulating layer 54 is provided to be in contact with the first electrode layer 50. However, the insulating layer 54 may be provided to be in contact with the second electrode layer 53 by reversing the order of the insulating layer and the electroluminescent layer.

In the case of the dispersed inorganic EL element, a particulate light emitting material is dispersed in a binder to form a film electroluminescent layer. In the case where a particle having a desired size cannot be sufficiently obtained by a production method of a light emitting material, the material may be processed into particles by crushing in a mortar or the like. The binder is a substance for fixing a particulate light emitting material in a dispersed manner and holding the material in shape as the electroluminescent layer. The light emitting material is uniformly dispersed and fixed in the electroluminescent layer by the binder.

In the case of the dispersed inorganic EL element, the electroluminescent layer can be formed by a droplet discharge method which can selectively form the electroluminescent layer, a printing method (such as screen printing or off-set printing), a spin-coating method, a dipping method, a dispenser method, or the like. The thickness is not particularly limited, but it is preferably in the range of 10 nm to 1000 nm. In addition, in the electroluminescent layer containing the light emitting material and the binder, the proportion of the light emitting material is preferably in the range of 50 wt % to 80 wt %.

Figure 13A:
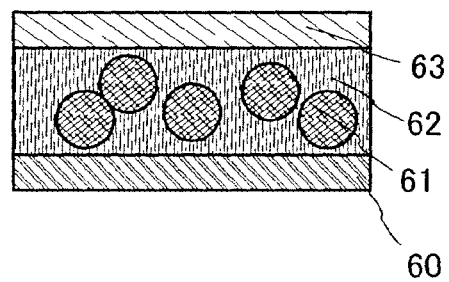
FIGS. 13A to 13C are each a cross-sectional view 2 of an inorganic EL element.
Figure 13B:
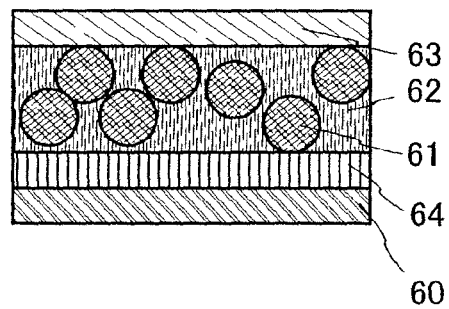
Figure 13C:
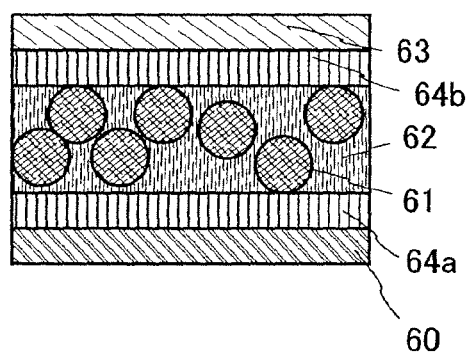

FIGS. 13A to 13C each show an example of a dispersed inorganic EL element which can be used as a display element. A display element in FIG. 13A has a stacked structure of a first electrode layer 60, an electroluminescent layer 62, and a second electrode layer 63, and contains a light emitting material 61 held by a binder in the electroluminescent layer 62.

As the binder which can be used in this embodiment mode, an organic material or an inorganic material, or a mixed material of an organic material and an inorganic material can be used. As an organic material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant high molecular compound such as aromatic polyamide or polybenzimidazole, or a siloxane resin may be used. Note that the siloxane resin corresponds to a resin including a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin of polyvinyl alcohol, polyvinylbutyral, or the like, a phenol resin, a novolac resin, an acrylic resin, a melamine resin, a urethane resin, or an oxazole resin (polybenzoxazole) may be used. A dielectric constant can be adjusted by appropriately mixing high dielectric constant fine particles such as barium titanate ($BaTiO_3$) or strontium titanate ($SrTiO_3$) in the above resin.

As an inorganic material included in the binder, a material selected from substances containing inorganic materials can be used, such as silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), or ZnS. A dielectric constant of the electroluminescent layer including the light emitting material and the binder can be controlled by making an organic material to contain a high dielectric constant inorganic material (by addition or the like), so that a dielectric constant can be increased.

In a manufacturing process, a light emitting material is dispersed in a solution including a binder. As a solvent of the solution including the binder that can be used in this embodiment mode, a solvent in which a binder material is soluble and which can produce a solution having a viscosity suitable for a method for forming the electroluminescent layer (various wet processes) and a desired thickness, may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

Each of the display elements shown in FIGS. 13B and 13C has a structure in which an insulating layer is provided between the electrode layer and the electroluminescent layer in the display element in FIG. 13A. The display element shown in FIG. 13B includes an insulating layer 64 between the first electrode layer 60 and the electroluminescent layer 62. The display element shown in FIG. 13C includes an insulating layer 64a between the first electrode layer 60 and the electroluminescent layer 62 and an insulating layer 64b between the second electrode layer 63 and the electroluminescent layer 62. As described above, the insulating layer may be provided between the electroluminescent layer and either or both of the pair of electrode layers sandwiching the electroluminescent layer. In addition, the insulating layer may be a single layer or a stack of a plurality of layers.

In FIG. 13B, the insulating layer 64 is provided to be in contact with the first electrode layer 60. However, the insulating layer 64 may be provided to be in contact with the second electrode layer 63 by reversing the order of the insulating layer and the electroluminescent layer.

An insulating layer such as the insulating layer 54 in FIGS. 12A to 12C or the insulating layer 64 in FIGS. 13A to 13C is not particularly limited, but it preferably has dielectric strength voltage and dense film quality. Furthermore, it preferably has a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film thereof, or a stacked film of two or more kinds can be used. These insulating films can be formed by sputtering, evaporation, CVD, or the like. Alternatively, the insulating layer may be formed by dispersing particles of the insulating material in a binder. A binder material may be formed using a material and a method similar to those of the binder included in the electroluminescent layer. The thickness is not particularly limited, but it is preferably in the range of 10 nm to 1000 nm.

The display element described in this embodiment mode, which can provide light emission by applying voltage between a pair of electrode layers sandwiching the electroluminescent layer, can be operated by either DC drive or AC drive.

Embodiment Mode 9

In each of Embodiment Modes 1 to 8, the example of the display device mainly using electroluminescence is described. However, the present invention is applicable to various active matrix display devices. Other display devices include, for example, a liquid crystal display device, an FED (Field Emission Display), and the like.

Embodiment Mode 10

The present invention can be applied to various semiconductor devices as well as a display device (note that a semiconductor device is a concept including a display device).

Figure 15A:
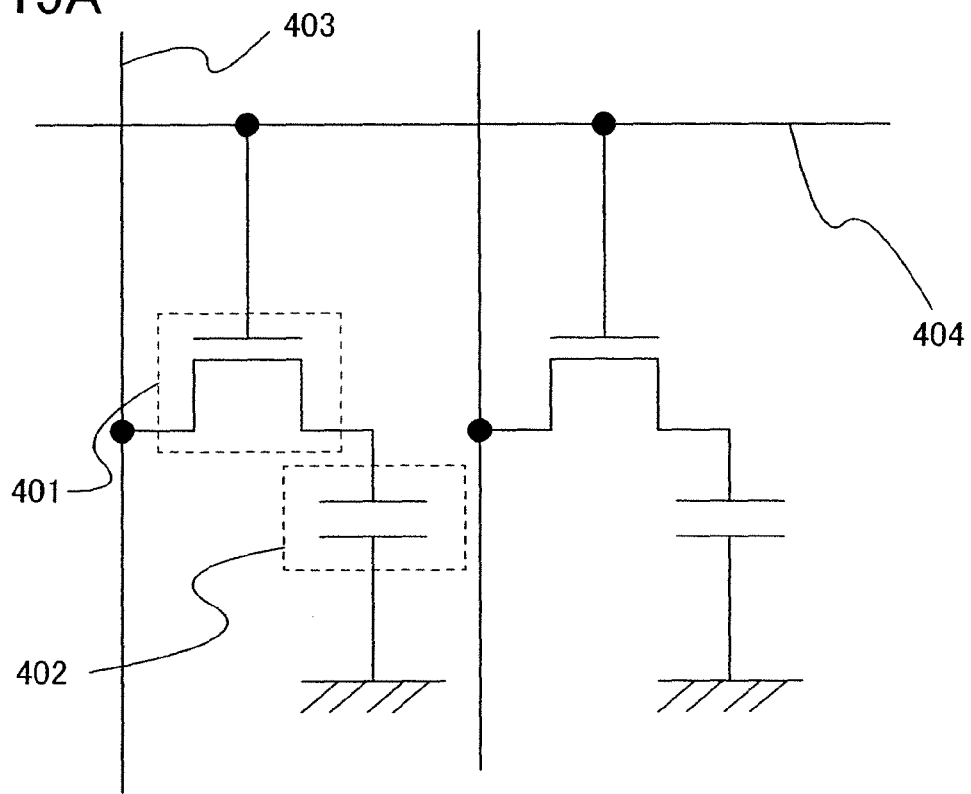
FIGS. 15A and 15B are each a circuit diagram for DRAM.

For example, there is a memory element (storage element) such as DRAM (Dynamic Random Access Memory). FIG. 15A is a circuit diagram of the DRAM. A unit in which one terminal of a transistor 401 and a cell plate 402 (capacitor) are connected to each other is considered as one cell. In addition, one cell is connected to another cell with a wiring. The other terminal of the transistor 401 is connected to a bit line 403. In addition, a gate of the transistor 401 is connected to a word line 404.

The principle of operation of the DRAM is described. In the case where the transistor 401 is an N-channel transistor, by applying a positive voltage to the bit line 403 and the word line 404, a charge is stored in the cell plate 402 during a data writing period. During a data reading period, by applying a positive voltage to the word line, the charge stored in the cell plate 402 flows to the bit line 403. In the case where the transistor 401 is a P-channel transistor, a voltage with reversed polarity may be applied during each period.

Furthermore, the capacitance of the cell plate 402 increases as the area thereof increases. By increasing the capacitance, generation of a soft error (an error in which information stored in the memory cell is lost (rewritten) due to collision of cosmic rays and the like), or the like can be suppressed. Accordingly, in order to increase the capacitance of the capacitor, it is necessary to increase the surface area of the capacitor.

Thus, a wiring is provided between adjacent electrodes; a thin film transistor connected to a capacitor is arranged under the wiring; and a channel width direction of a channel formation region of the thin film transistor is arranged parallel to the direction in which current flows through the wiring, or arranged parallel to a longitudinal direction of the electrode. Thus, the capacitance of the capacitor can be increased.

Figure 16:
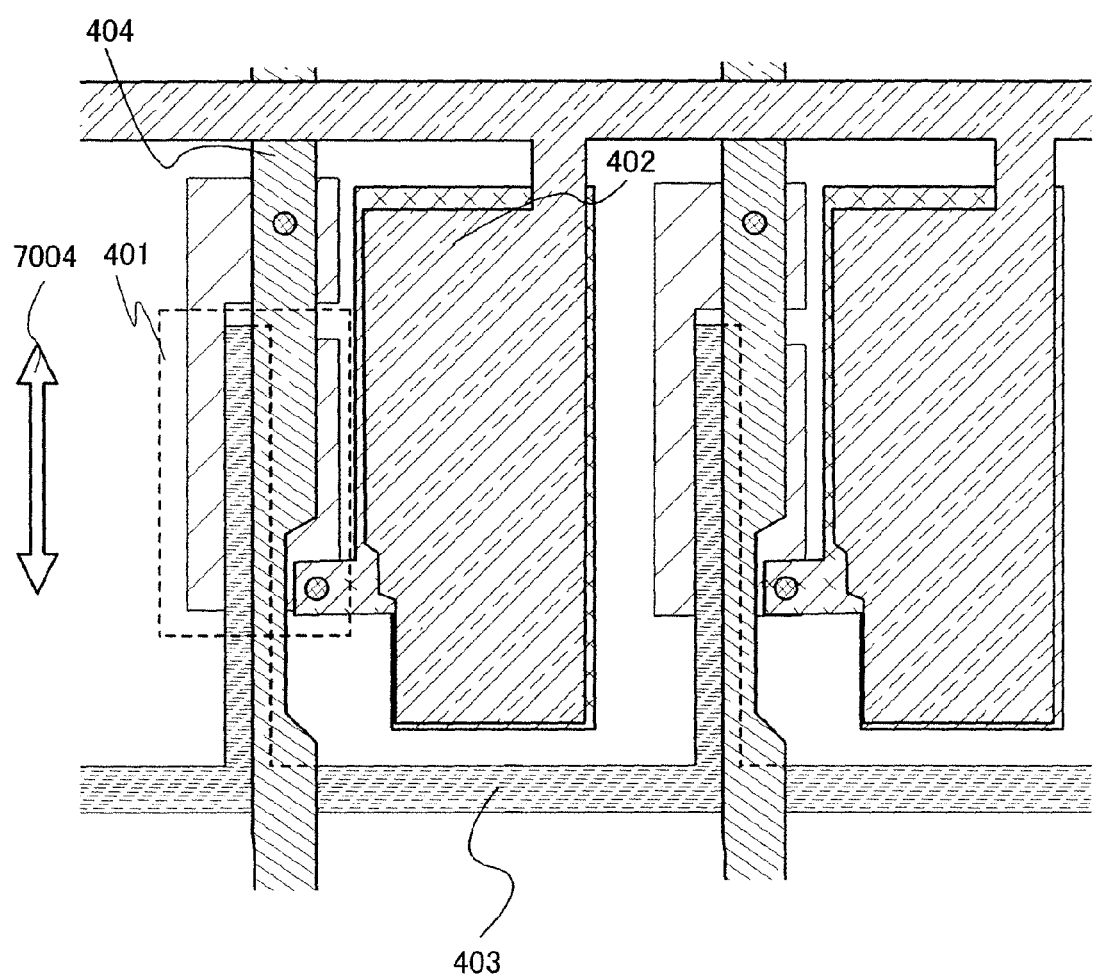
FIG. 16 is a layout for DRAM.

In this embodiment mode, as shown in FIG. 16, a channel width direction of the transistor 401 is arranged parallel to a longitudinal direction of the cell plate 402 (or the electrode of the capacitor) (an arrow 7004 in FIG. 16). The transistor 401 may have a single-gate structure or a multi-gate structure.

Note that the DRAM may have a stack type structure or a trench type structure. The stack type structure is such that an insulating film is formed, and then, a step is provided over a substrate by etching the insulating film, and a capacitor is embedded in the step. Meanwhile, the trench type structure is such that a step is provided by etching a substrate, and a capacitor is embedded in the step.

Note that as a method for manufacturing the DRAM having the stack type structure, a transistor is formed using SOI (Silicon On Insulator) by a known method, or a TFT is formed by the method described in Embodiment Mode 3. Then, an insulating film can be formed using acrylic, polyimide, siloxane, silicon oxide, silicone nitride, or the like, for example. Next, the insulating film is patterned, and then, a step is formed by etching.

Then, a lower electrode which is in contact with either one of a source region or drain region of the transistor can be formed of metal such as aluminum, for example. Next, a dielectric film can be formed of titanium oxide, tantalum oxide, silicone nitride, silicon oxide, or the like, for example. Then, an upper electrode can be formed of tungsten silicide, polysilicon, or the like, for example, thereby forming a capacitor in the step.

In addition, as a method for manufacturing the DRAM having the trench type structure, first, patterning is performed on a substrate, and then, a step is formed on the substrate by etching. Then, a transistor is formed using SOI (Silicon On Insulator) by a known method, or a TFT is formed by the method described in Embodiment Mode 3.

Then, a lower electrode which is in contact with either one of a source region or drain region of the transistor can be formed of metal such as aluminum, for example. Next, a dielectric film can be formed of titanium oxide, tantalum oxide, silicone nitride, silicon oxide, or the like, for example. Then, an upper electrode can be formed of tungsten silicide, polysilicon, or the like, for example, thereby forming a capacitor in the step.

Figure 15B:
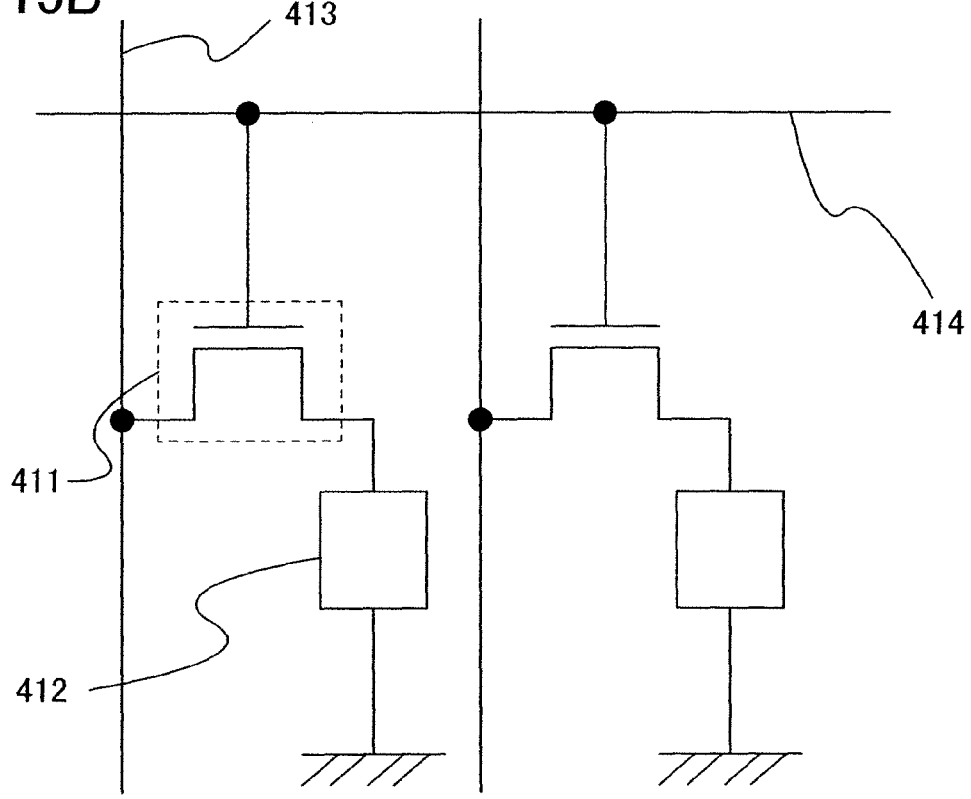

In addition, even when an element other than the DRAM is used, the present invention can be used in the case where the area of the element is expanded. FIG. 15B is a circuit diagram of an element to which the present invention can be applied. A unit in which one terminal of a transistor 411 and an element 412 are connected to each other is considered as one cell. In addition, one cell is connected to another cell with a wiring. The other terminal of the transistor 411 is connected to a first wiring 413. In addition, a gate of the transistor 411 is connected to a second wiring 414.

Thus, a wiring is provided between the adjacent elements; a thin film transistor connected to the element is arranged under the wiring; and a channel width direction of a channel formation region of the thin film transistor is arranged parallel to the direction in which current flows through the wiring, or arranged parallel to a longitudinal direction of the element. Thus, the area of the element or the number of elements can be increased.

As the element 412, an organic memory, a photodiode, a piezoelectric element, or the like can be used, for example.

When an organic memory is used as the element 412, a storage element can be formed. Note that, as a method of the organic memory, there are a method in which memory is performed electrically by the selection of the first wiring 413 and the second wiring 414; a method in which memory is performed optically in such a way that the organic memory element, which uses an organic material, that is, a conjugated polymer material doped with a photoacid generator, is irradiated with laser light; and the like. When the organic memory element is formed, a certain amount of the area is necessary. In addition, in order to increase memory capacity, it is effective to increase the number of memory elements. Therefore, by using the structure of the present invention, the number of memory elements can be increased, which is effective.

In addition, an optical sensor can be formed when a photodiode is used for the element 412. As the kinds of photodiodes, there are a PN photodiode, a PIN photodiode, an avalanche photodiode, a Schottky photodiode, and the like. The photoelectric conversion efficiency increases as the area of the photodiode increases; therefore, it is effective to use the structure of the present invention.

In addition, by using a piezoelectric element as the element 412, a pressure sensor can be formed. Furthermore, a touch panel can be formed by forming a piezoelectric element and a display element over one substrate. As the piezoelectric element, there are a pressure sensitive sensor provided with a parallel-plate capacitor; a strain gage pressure sensor in which p-type silicon crystal is doped with an n-type impurity by thermal diffusion and a compensated intrinsic semiconductor region with high-resistance is used as a strain gage; and the like. When the piezoelectric element is formed, a certain amount of the area is necessary. In addition, a sensor with high sensitivity can be provided when the piezoelectric element has a larger area. Thus, it is effective to use the structure of the present invention.

As described above, the present invention can be applied to various semiconductor devices.

Embodiment Mode 11

A display device of the present invention can be used for display portions of various electronic devices. In particular, a display device of the present invention is desirably used for mobile devices required to be thin and light weight. In addition, the semiconductor device of the present invention can be used for various electronic devices. In particular, the semiconductor device of the present invention is desirably used for mobile devices required to be thin and light weight.

Examples of electronic devices using the display device or the semiconductor device of the present invention in their housings are given as follows: a television apparatus (simply referred to as TV, television, or television receiver), a camera (a video camera, a digital camera, or the like), a goggle type display, a navigation system, an audio reproducing device (car audio, an audio component, or the like), a computer, a game machine, a portable information terminal (a mobile computer, a portable phone, a portable game machine, an electronic book device, or the like), an image reproducing device provided with a recording medium (specifically, a device which reproduces a recording medium such as a DVD (Digital Versatile Disc), an HD DVD (High Definition DVD), or a Blu-ray Disk and which is equipped with a display for displaying the image), and other electronics each having a display portion. Specific examples of these electronic devices are shown in FIGS. 17A to 17F.

Figure 17A:
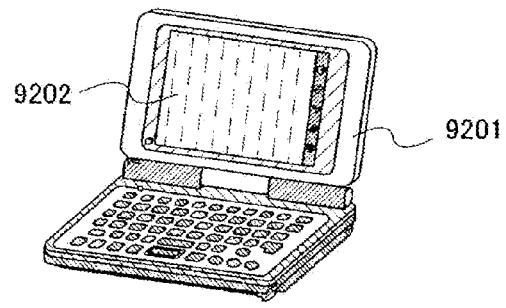
FIGS. 17A to 17F are examples of electronic devices.

A portable information terminal shown in FIG. 17A includes a main body 9201, a display portion 9202, and the like.

Figure 17B:
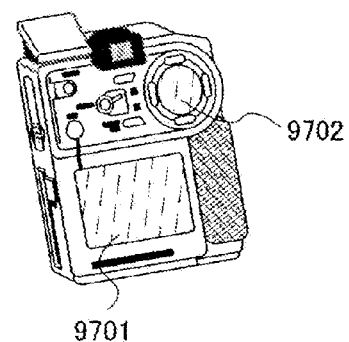

A digital video camera shown in FIG. 17B includes a main body 9702, a display portion 9701, and the like.

Figure 17C:
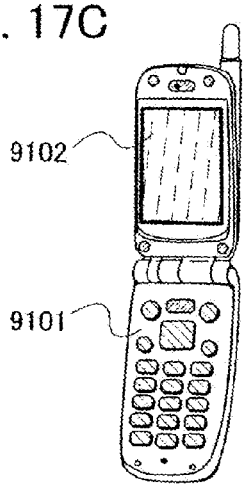

A portable terminal shown in FIG. 17C includes a main body 9101, a display portion 9102, and the like.

Figure 17D:
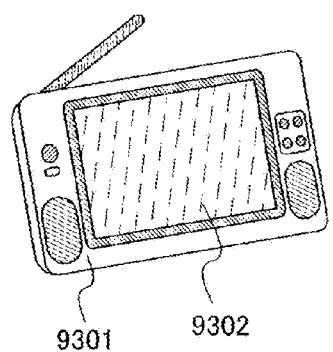

A portable television apparatus shown in FIG. 17D includes a main body 9301, a display portion 9302, and the like. Such a television apparatus can be widely applied to a small size television apparatus mounted on a portable terminal such as a portable phone, a medium size one which can be carried, and a large size one (e.g., 40 inches or more).

Figures 17E, 17F:
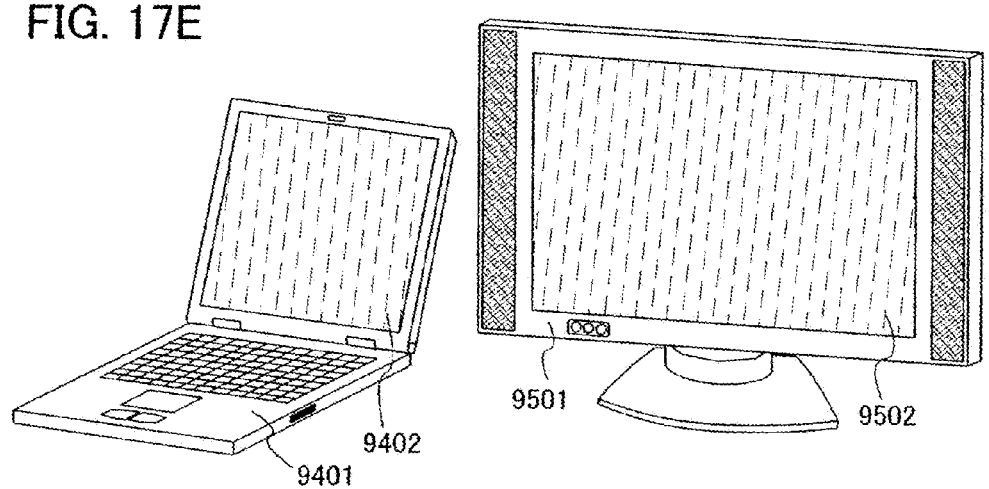

A portable computer shown in FIG. 17E includes a main body 9401, a display portion 9402, and the like.

A television apparatus shown in FIG. 17F includes a main body 9501, a display portion 9502, and the like.

As described above, the present invention can be applied widely and used in manufacturing methods of every field of electronic devices.

This application is based on Japanese Patent Application serial No. 2006-199292 filed in Japan Patent Office on Jul. 21, 2006, the entire contents of which are hereby incorporated by reference.

What is claimed is:

1. A semiconductor device comprising:
a first transistor comprising a first semiconductor layer including a first channel formation region;
a second transistor comprising a second semiconductor layer including a second channel formation region;
a first wiring electrically connected to one of a source and a drain of the first transistor;
a second wiring electrically connected to one of a source and a drain of the second transistor;
a first conductive layer electrically connected to the other of the source and the drain of the first transistor;
a second conductive layer electrically connected to the other of the source and the drain of the second transistor; and
an electrode,
wherein the first channel formation region is capable of flowing carriers to a first direction,
wherein the second channel formation region is capable of flowing carriers to the first direction,
wherein the first wiring is capable of flowing a current in a second direction,
wherein the second wiring is capable of flowing a current in the second direction,
wherein the first conductive layer is capable of being a first electrode of a first capacitor,
wherein the second conductive layer is capable of being a first electrode of a second capacitor,
wherein the electrode is capable of being a second electrode of the first capacitor and a second electrode of the second capacitor, and
wherein the first direction intersects with the second direction.

2. The semiconductor device according to claim 1, wherein a longitudinal direction of the first conductive layer is parallel to the second direction.

3. The semiconductor device according to claim 1,
wherein the first semiconductor layer includes a region,
wherein the region is capable of being one of a source region and a drain region, and
wherein a longitudinal direction of the region is parallel to the second direction.

4. The semiconductor device according to claim 1, wherein the first semiconductor layer includes a third channel formation region.

5. The semiconductor device according to claim 1, wherein a shape of the first channel formation region is a rectangular shape.

6. A semiconductor device comprising:
a first transistor comprising a first semiconductor layer including a first channel formation region;
a second transistor comprising a second semiconductor layer including a second channel formation region;
a first wiring electrically connected to one of a source and a drain of the first transistor;
a second wiring electrically connected to one of a source and a drain of the second transistor;
a first conductive layer electrically connected to the other of the source and the drain of the first transistor;
a second conductive layer electrically connected to the other of the source and the drain of the second transistor; and
an electrode,
wherein the first channel formation region is capable of flowing carriers to a first direction,
wherein the second channel formation region is capable of flowing carriers to the first direction,
wherein a longitudinal direction of the first wiring is parallel to a second direction,
wherein a longitudinal direction of the second wiring is parallel to the second direction,
wherein the first conductive layer is capable of being a first electrode of a first capacitor,
wherein the second conductive layer is capable of being a first electrode of a second capacitor,
wherein the electrode is capable of being a second electrode of the first capacitor and a second electrode of the second capacitor, and
wherein the first direction intersects with the second direction.

7. The semiconductor device according to claim 6, wherein a longitudinal direction of the first conductive layer is parallel to the second direction.

8. The semiconductor device according to claim 6,
wherein the first semiconductor layer includes a region,
wherein the region is capable of being one of a source region and a drain region, and
wherein a longitudinal direction of the region is parallel to the second direction.

9. The semiconductor device according to claim 6, wherein the first semiconductor layer includes a third channel formation region.

10. The semiconductor device according to claim 6, wherein a shape of the first channel formation region is a rectangular shape.

11. A semiconductor device comprising:
a first transistor comprising a first semiconductor layer including a first channel formation region;
a second transistor comprising a second semiconductor layer including a second channel formation region;
a first wiring electrically connected to one of a source and a drain of the first transistor;
a second wiring electrically connected to one of a source and a drain of the second transistor;
a first conductive layer electrically connected to the other of the source and the drain of the first transistor;
a second conductive layer electrically connected to the other of the source and the drain of the second transistor; and
an electrode,
wherein a channel length direction of the first transistor is parallel to a first direction,
wherein a channel length direction of the second transistor is parallel to the first direction,
wherein the first wiring is capable of flowing a current in a second direction,
wherein the second wiring is capable of flowing a current in the second direction,
wherein the first conductive layer is capable of being a first electrode of a first capacitor,
wherein the second conductive layer is capable of being a first electrode of a second capacitor, wherein the electrode is capable of being a second electrode of the first capacitor and a second electrode of the second capacitor, and wherein the first direction intersects with the second direction.

12. The semiconductor device according to claim 11, wherein a longitudinal direction of the first conductive layer is parallel to the second direction.

13. The semiconductor device according to claim 11, wherein the first semiconductor layer includes a region, wherein the region is capable of being one of a source region and a drain region, and wherein a longitudinal direction of the region is parallel to the second direction.

14. The semiconductor device according to claim 11, wherein the first semiconductor layer includes a third channel formation region.

15. The semiconductor device according to claim 11, wherein a shape of the first channel formation region is a rectangular shape.

16. A semiconductor device comprising:

a first transistor comprising a first semiconductor layer including a first channel formation region;

a second transistor comprising a second semiconductor layer including a second channel formation region;

a first wiring electrically connected to one of a source and a drain of the first transistor;

a second wiring electrically connected to one of a source and a drain of the second transistor;

a first conductive layer electrically connected to the other of the source and the drain of the first transistor;

a second conductive layer electrically connected to the other of the source and the drain of the second transistor; and an electrode, wherein a channel length direction of the first transistor is parallel to a first direction, wherein a channel length direction of the second transistor is parallel to the first direction, wherein a longitudinal direction of the first wiring is parallel to a second direction, wherein a longitudinal direction of the second wiring is parallel to the second direction, wherein the first conductive layer is capable of being a first electrode of a first capacitor, wherein the second conductive layer is capable of being a first electrode of a second capacitor, wherein the electrode is capable of being a second electrode of the first capacitor and a second electrode of the second capacitor, and wherein the first direction intersects with the second direction.

17. The semiconductor device according to claim 16, wherein a longitudinal direction of the first conductive layer is parallel to the second direction.

18. The semiconductor device according to claim 16, wherein the first semiconductor layer includes a region, wherein the region is capable of being one of a source region and a drain region, and wherein a longitudinal direction of the region is parallel to the second direction.

19. The semiconductor device according to claim 16, wherein the first semiconductor layer includes a third channel formation region.

20. The semiconductor device according to claim 16, wherein a shape of the first channel formation region is a rectangular shape.

* * * * *